(12) United States Patent
Kohno et al.

(10) Patent No.: US 10,840,058 B2
(45) Date of Patent: Nov. 17, 2020

(54) ABERRATION MEASUREMENT METHOD AND ELECTRON MICROSCOPE

(71) Applicant: JEOL Ltd., Tokyo (JP)

(72) Inventors: Yuji Kohno, Tokyo (JP); Akiho Nakamura, Tokyo (JP)

(73) Assignee: JEOL Ltd., Tokyo (JP)

(*) Notice: Subject to any disclaimer, the term of this patent is extended or adjusted under 35 U.S.C. 154(b) by 321 days.

(21) Appl. No.: 16/109,837

(22) Filed: Aug. 23, 2018

(65) Prior Publication Data

US 2019/0066968 A1 Feb. 28, 2019

(30) Foreign Application Priority Data

Aug. 24, 2017 (JP) .................................. 2017-161195

(51) Int. Cl.
| | |
|---|---|
| *H01J 37/153* | (2006.01) |
| *H01J 37/26* | (2006.01) |
| *H01J 37/28* | (2006.01) |
| *H01J 37/244* | (2006.01) |
| *H01J 37/147* | (2006.01) |

(Continued)

(52) U.S. Cl.
CPC ........ *H01J 37/153* (2013.01); *H01J 37/1478* (2013.01); *H01J 37/222* (2013.01); *H01J 37/244* (2013.01); *H01J 37/265* (2013.01); *H01J 37/28* (2013.01); *G01N 23/04* (2013.01); *H01J 2237/1534* (2013.01); *H01J 2237/2487* (2013.01); *H01J 2237/24465* (2013.01); *H01J 2237/24528* (2013.01); *H01J 2237/2802* (2013.01); *H01J 2237/282* (2013.01); *H01J 2237/2823* (2013.01)

(58) Field of Classification Search
CPC .............. G11B 7/0956; G11B 7/13927; G11B 7/24038; G11B 7/13925; G11B 7/1369; G11B 7/08511; G11B 7/1378; G11B 7/0908; G11B 7/1392; G11B 7/0945; H01J 37/141; H01J 37/1471; H01J 37/1478; H01J 37/153
See application file for complete search history.

(56) References Cited

U.S. PATENT DOCUMENTS

| | | | |
|---|---|---|---|
| 9,136,087 B2 * | 9/2015 | Lazic .................... | H01J 37/153 |
| 2007/0120055 A1 | 5/2007 | Sawada et al. | |

(Continued)

FOREIGN PATENT DOCUMENTS

| | | |
|---|---|---|
| JP | 2007180013 A | 7/2007 |
| JP | 201222971 A | 2/2012 |

*Primary Examiner* — David E Smith
*Assistant Examiner* — Hsien C Tsai
(74) *Attorney, Agent, or Firm* — The Webb Law Firm

(57) ABSTRACT

An aberration measurement method for an objective lens in an electron microscope including an objective lens which focuses an electron beam that illuminates a specimen, and a detector which detects an electron beam having passed through the specimen, includes: introducing a coma aberration to the objective lens; measuring an aberration of the objective lens before introducing the coma aberration to the objective lens; measuring an aberration of the objective lens after introducing the coma aberration to the objective lens; and obtaining a position of an optical axis of the objective lens on a detector plane of the detector based on measurement results of the aberration of the objective lens before and after introducing the coma aberration.

13 Claims, 21 Drawing Sheets

(51) Int. Cl.
*H01J 37/22* (2006.01)
*G01N 23/04* (2018.01)

(56) References Cited

U.S. PATENT DOCUMENTS

2013/0068949 A1\* 3/2013 Urano .................. H01J 37/153
250/310
2013/0112875 A1\* 5/2013 Nakamura .............. H01J 37/28
250/311

\* cited by examiner

ABERRATION MEASUREMENT METHOD AND ELECTRON MICROSCOPE

CROSS-REFERENCE TO RELATED APPLICATION

This application claims priority to Japanese Patent Application No. 2017-161195 filed Aug. 24, 2017, the disclosure of which is hereby incorporated in its entirety by reference.

Japanese Patent Application No. 2017-161195, filed on Aug. 24, 2017, is hereby incorporated by reference in its entirety.

BACKGROUND OF THE INVENTION

Field of the Invention

The present invention relates to an aberration measurement method and an electron microscope.

Description of Related Art

A scanning transmission electron microscope (STEM) is an electron microscope in which a focused electron beam is scanned over a specimen and intensities of detection signals due to transmission electrons or scattered electrons from the specimen are mapped in synchronization with the scanning of the electron beam to obtain a scanning transmission electron microscope image (hereinafter, also referred to as a "STEM image"). In recent years, scanning transmission electron microscopes have been attracting attention due to their ability to produce an extremely high spatial resolution at the atomic scale. Since the spatial resolution of a scanning transmission electron microscope depends on a beam diameter of an electron beam incident on a specimen, reducing aberration is important in achieving higher resolutions.

For example, JP-A-2012-22971 discloses an aberration measurement method in a scanning transmission electron microscope mounted with a segmented detector. In the aberration measurement method disclosed in JP-A-2012-22971, a STEM image is simultaneously acquired from each of a plurality of detection regions with mutually different positions using the segmented detector, and each aberration coefficient is calculated using the simultaneously-acquired STEM images.

In addition, for example, JP-A-2007-180013 discloses an aberration measurement method using a Ronchigram. In this case, a Ronchigram is an infinite distance (back focal plane) projective pattern formed by an electron beam focused on a specimen in a STEM image observation mode.

FIGS. 14 and 15 are diagrams for explaining an aberration measurement method in a scanning transmission electron microscope. For the sake of convenience, FIGS. 14 and 15 only show an illumination system aperture 1002, an objective lens (an illumination system) 1004, and a detector 1006 of a scanning transmission electron microscope.

As shown in FIGS. 14 and 15, in a scanning transmission electron microscope, when an incidence angle of an electron beam relative to a specimen S is changed, a passage position of the electron beam on the specimen S changes depending on an order, a magnitude, and an orientation of each aberration present in the objective lens 1004. In this case, when an electron beam is detected for each incidence angle and a STEM image is generated for each incidence angle, a relative image shift appears between STEM images. The image shift corresponds to a first derivative (a geometrical aberration) of a wave aberration. Therefore, obtaining the image shift enables an aberration of the objective lens to be measured.

However, if there is an axial disagreement between an optical axis of an objective lens and an axis of a detector when performing aberration measurement using a geometrical aberration, an apparent aberration attributable to the axial disagreement is detected in addition to an original aberration to be measured. This apparent aberration is an effect of a high-order aberration appearing as an apparent low-order aberration. For example, from a spherical aberration, a coma aberration appears as a primary apparent aberration. In addition, from a coma aberration, a two-fold astigmatism and a defocus appear as primary apparent aberrations. The apparent aberration is superimposed on an original aberration.

FIGS. 16 and 17 are diagrams for explaining how an apparent aberration due to an axial disagreement occurs.

In FIGS. 16 and 17, only a spherical aberration is present in the objective lens 1004. As shown in FIG. 16, when there is no axial disagreement between an optical axis 1005 of the objective lens 1004 and an axis 1007 (a center of a detector plane, a position of a coordinate origin when calculating an aberration) of the detector 1006, only a spherical aberration is detected.

Conversely, as shown in FIG. 17, when there is an axial disagreement between the optical axis 1005 of the objective lens 1004 and the axis 1007 of the detector 1006, the axial disagreement causes an incidence angle of an electron beam incident on the detector plane as viewed from the side of the detector 1006 to differ from an actual incidence angle of an electron beam incident on a specimen S. As a result a low-order apparent aberration (in this case, a coma aberration) is detected. It should be noted that, in FIG. 17, a path of an electron beam when there is no axial disagreement is indicated by a dashed line and a path of an electron beam when there is an axial disagreement as viewed from the side of the detector 1006 is indicated by a solid line.

As described above, when an axial disagreement is present, it is difficult to correctly calculate an original low-order aberration due to an occurrence of a low-order apparent aberration. Therefore, a position of the optical axis 1005 of the objective lens 1004 on the detector plane of the detector 1006 must be accurately determined so that the optical axis 1005 and the axis 1007 are aligned with each other.

FIGS. 18 and 19 are diagrams for explaining an example of a method of obtaining a position of the optical axis 1005 of the objective lens 1004. For the sake of convenience, FIGS. 18 and 19 only show the illumination system aperture 1002, an illumination system deflector 1012, a scanning coil 1014, and the objective lens 1004. It should be noted that FIG. 18 shows a state of overfocus and FIG. 19 shows a state of underfocus.

A position of the optical axis 1005 on the detector plane of the detector 1006 can be measured from STEM images before and after changing a defocus of the objective lens 1004. When a defocus is added to the objective lens 1004, a STEM image of the specimen S blurs and, at the same time, the STEM image of the specimen S shifts in accordance with an incidence angle of an electron beam. When there is a disagreement between the optical axis 1005 of the objective lens 1004 and the axis 1007 of the detector 1006, an apparent aberration (a translation) appears in addition to an image shift due to the defocus. By obtaining a direction and a magnitude of an image shift due to the defocus from the STEM images before and after adding the defocus, the position of the optical axis 1005 of the objective lens 1004 can be obtained. A position where only an image shift due to the defocus is created and an apparent aberration (a translation) does not appear is the position of the optical axis 1005.

However, when there is an axial disagreement between the optical axis 1005 of the objective lens 1004 and an objective current center of the objective lens 1004, an image shift (a translation) attributable to a disagreement of the objective current center is added as the defocus is changed.

FIGS. 20 and 21 are diagrams for explaining an image shift due to an axial disagreement between the optical axis 1005 of the objective lens 1004 and the objective current center of the objective lens 1004. It should be noted that FIG. 20 represents a case where there is no axial disagreement between the optical axis 1005 of the objective lens 1004 and the objective current center and FIG. 21 represents a case where there is an axial disagreement between the objective lens 1004 and the objective current center. In addition, in FIGS. 20 and 21, overfocus is indicated by a dot-and-dash line and underfocus is indicated by a dashed line.

When there is an axial disagreement between the optical axis 1005 of the objective lens 1004 and the objective current center, an image shift (a translation) attributable to a disagreement of the objective current center is generated in response to change of a defocus, as shown in FIG. 21.

The image shift is expressed as a linear function relative to a defocus and does not have an extreme value. As a result, it is difficult to separate the image shift due to an axial disagreement between the optical axis 1005 and the axis 1007 from the image shift due to a disagreement between the optical axis 1005 and the objective current center. Therefore, with a method of measuring a position of the optical axis 1005 on the detector plane of the detector 1006 from STEM images before and after changing a defocus of the objective lens 1004, a position of the optical axis 1005 on the detector plane cannot be accurately obtained.

SUMMARY OF THE INVENTION

The invention provides an aberration measurement method capable of accurately measuring an aberration of an objective lens and an electron microscope capable of accurately measuring an aberration of an objective lens.

According to a first aspect of the invention, there is provided an aberration measurement method for an objective lens in an electron microscope including an objective lens which focuses an electron beam that illuminates a specimen, and a detector which detects an electron beam having passed through the specimen, the aberration measurement method comprising:

introducing a coma aberration to the objective lens;

measuring an aberration of the objective lens before introducing the coma aberration to the objective lens;

measuring an aberration of the objective lens after introducing the coma aberration to the objective lens; and obtaining a position of an optical axis of the objective lens on a detector plane of the detector based on measurement results of the aberration of the objective lens before and after introducing the coma aberration.

According to a second aspect of the invention, there is provided an electron microscope comprising:

an objective lens which focuses an electron beam that illuminates a specimen;

a detector which detects an electron beam having passed through the specimen; and an aberration measuring unit which measures an aberration of the objective lens, the aberration measuring unit performing a process of obtaining a position of an optical axis of the objective lens on a detector plane of the detector based on measurement results of an aberration before and after introducing a coma aberration to the objective lens.

DESCRIPTION OF THE INVENTION

According to an embodiment of the invention, there is provided an aberration measurement method for an objective lens in an electron microscope including an objective lens which focuses an electron beam that illuminates a specimen, and a detector which detects an electron beam having passed through the specimen, the aberration measurement method comprising:

introducing a coma aberration to the objective lens;

measuring an aberration of the objective lens before introducing the coma aberration to the objective lens;

measuring an aberration of the objective lens after introducing the coma aberration to the objective lens; and obtaining a position of an optical axis of the objective lens on a detector plane of the detector based on measurement results of the aberration of the objective lens before and after introducing the coma aberration.

With such an aberration measurement method, since a position of an optical axis of an objective lens on a detector plane can be obtained based on a change in an apparent aberration before and after introducing the coma aberration to the objective lens, the position can be readily and accurately obtained. Accordingly, a measurement of an aberration can be performed in a state where the optical axis of the objective lens and an axis of a detector are aligned with each other. Therefore, an apparent aberration does not occur and the aberration of the objective lens can be accurately measured.

According to an embodiment of the invention, there is provided an electron microscope comprising:

an objective lens which focuses an electron beam that illuminates a specimen;

a detector which detects an electron beam having passed through the specimen; and an aberration measuring unit which measures an aberration of the objective lens, the aberration measuring unit performing a process of obtaining a position of an optical axis of the objective lens on a detector plane of the detector based on measurement results of an aberration before and after introducing a coma aberration to the objective lens.

With such an electron microscope, since an aberration measuring unit performs a process of obtaining a position of an optical axis of an objective lens on a detector plane, an aberration of the objective lens can be accurately measured.

Hereinafter, preferred embodiments of the invention will be described in detail with reference to the drawings. It is to be understood that the embodiments described below are not intended to unreasonably limit contents of the invention described in the claims. It is also to be understood that all of the components described below are not necessarily essential constituents of the invention.

1. First Embodiment

1.1. Electron Microscope

Figure 1:
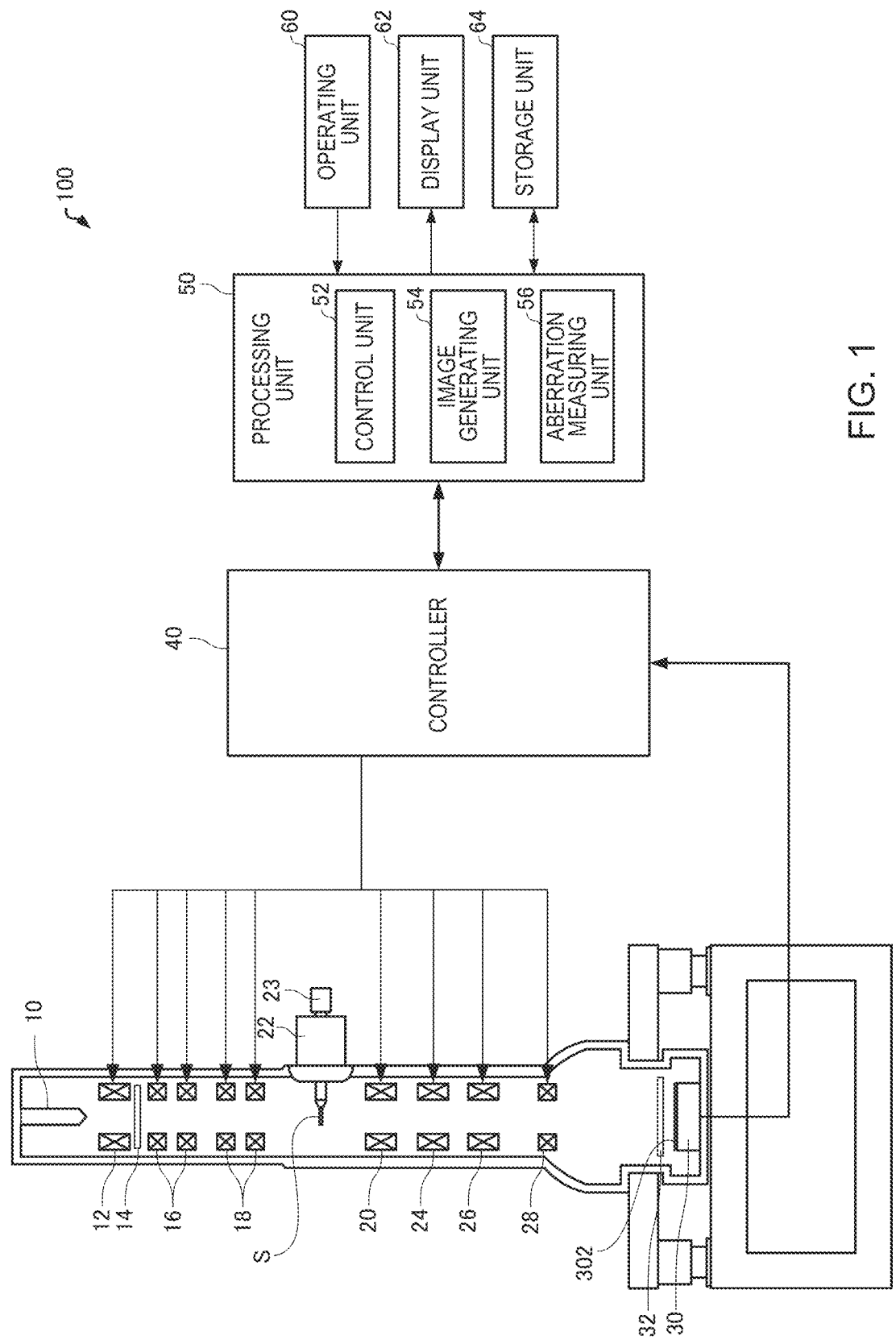
FIG. 1 is a diagram illustrating a configuration of an electron microscope according to a first embodiment.

First, an electron microscope according to a first embodiment will be described with reference to the drawings. FIG. 1 is a diagram illustrating a configuration of an electron microscope 100 according to the first embodiment.

The electron microscope 100 is a scanning transmission electron microscope (STEM). In other words, the electron microscope 100 is a device which generates a scanning transmission electron microscope image (a STEM image) by scanning an electron beam over a specimen S and acquiring intensity information of an electron beam having passed through the specimen S for each illumination position of the electron beam.

As shown in FIG. 1, the electron microscope 100 includes an electron source 10, an illumination system lens 12, an illumination system aperture 14, an illumination system deflector 16, a scanning coil 18, an objective lens 20, a specimen stage 22, a specimen holder 23, an intermediate lens 24, a projector lens 26, an imaging system deflector 28, a segmented detector 30 (an example of a detector), an aperture for aberration measurement 32, a controller 40, a processing unit 50, an operating unit 60, a display unit 62, and a storage unit 64.

The electron source 10 emits an electron beam. The electron source 10 is, for example, an electron gun which accelerates electrons emitted from a cathode by an anode and which emits an electron beam.

The illumination system lens 12 illuminates a specimen S with an electron beam emitted from the electron source 10. Although not illustrated, the illumination system lens 12 may be constituted by a plurality of electron lenses such as condenser lenses or condenser mini lenses. A condenser lens causes an electron beam emitted from the electron source 10 to converge. A condenser mini lens is disposed between the condenser lens and the objective lens 20. The condenser mini lens forms an electron beam having a convergence angle suitable for an observation mode.

The illumination system aperture 14 is an aperture for controlling a divergence angle or a dose of an electron beam that illuminates the specimen S.

The illumination system deflector 16 causes an electron beam emitted from the electron source 10 to be deflected two-dimensionally. The illumination system deflector 16 can cause the electron beam to shift on the specimen S and can cause the electron beam to tilt on the specimen S. The illumination system deflector 16 is constituted by, for example, a double deflection coil and is capable of deflecting an electron beam with a first-stage deflection coil and re-deflecting the deflected electron beam with a second-stage deflection coil. It should be noted that the illumination system deflector 16 is not limited to an example where the illumination system deflector 16 is constituted by a double deflection coil. For example, the illumination system deflector 16 may be constituted by deflection elements (deflection coils, deflection plates, and the like) disposed in multiple stages. By deflecting an electron beam with the illumination system deflector 16, an electron beam incident on the specimen S can be tilted.

The scanning coil 18 (an example of a scanning deflector) causes an electron beam emitted from the electron source 10 to be deflected two-dimensionally. The scanning coil 18 is a coil used in order to scan a surface of the specimen S with an electron beam (an electron probe).

The objective lens 20 causes an electron beam to converge on the specimen S to form an electron probe. In addition, the objective lens 20 forms an image with an electron beam having passed through the specimen S.

In the electron microscope 100, an illumination system for illuminating the specimen S with an electron beam is configured to include the illumination system lens 12, the illumination system aperture 14, the illumination system deflector 16, the scanning coil 18, and the objective lens 20.

Furthermore, although not illustrated, an aberration correction device for correcting an aberration of the illumination system (the objective lens 20) may be incorporated into the illumination system. Accordingly, by operating the aberration correction device based on a result of an aberration measurement to be described later, the aberration of the illumination system (the objective lens 20) can be reduced. It should be noted that the illumination system of the electron microscope 100 may include optical elements other than the lenses, apertures, and deflectors described above.

The specimen stage 22 holds the specimen S. In the illustrated example, the specimen stage 22 holds the specimen S via the specimen holder 23. The specimen stage 22 is capable of moving the specimen S in horizontal and vertical directions. In addition, the specimen stage 22 has a tilting mechanism and is capable of tilting (rotating) the specimen S around two axes that are perpendicular to each other.

The intermediate lens 24 and the projector lens 26 project an image formed by the objective lens 20 on a detector plane 302 of the segmented detector 30.

The imaging system deflector 28 causes an electron beam having passed through the specimen S to be deflected two-dimensionally. The imaging system deflector 28 is disposed before the segmented detector 30 (on an upstream side of a flow of an electron beam). By deflecting an electron beam with the imaging system deflector 28, an electron beam can be caused to be incident on a desired position on the detector plane 302 of the segmented detector 30.

The segmented detector 30 is a detector of which the detector plane 302 that detects an electron beam having passed through the specimen S is segmented into a plurality of detection regions.

Figure 2:
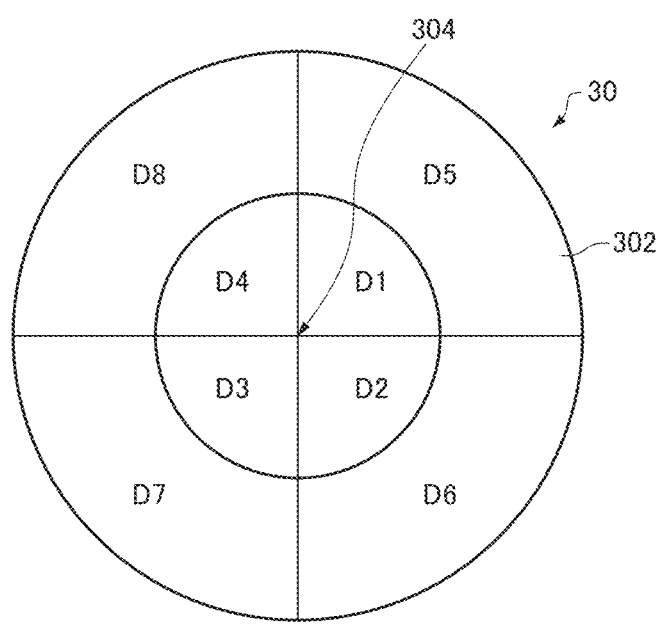
FIG. 2 is a diagram schematically illustrating a detector plane of a segmented detector.

FIG. 2 is a diagram schematically illustrating the detector plane 302 of the segmented detector 30.

As shown in FIG. 2, the detector plane 302 of the segmented detector 30 is segmented into a plurality of detection regions D1, D2, D3, D4, D5, D6, D7, and D8. In the example shown in FIG. 2, the segmented detector 30 is provided with four detection regions D1 to D8 formed by quartering the annular detector plane 302 in a direction of a deflection angle (an angular direction, a circumferential direction). In each of the detection regions D1 to D8, an electron beam can be independently detected.

It should be noted that that the number of detection regions on the detector plane 302 is not particularly limited. Although not illustrated, for example, the segmented detector 30 can be segmented into N-number of pieces (where N is a positive integer) in the direction of the deflection angle and M-number of layers (where M is a positive integer) in a radial direction so as to have N×M number of detection regions D1 to D (N×M) (in the example shown in FIG. 2, N=4 and M=2).

Although not illustrated, for example, the segmented detector 30 is configured to include a photoelectronic conversion element (a scintillator) which converts an electron beam into light, an optical transmission line (an optical fiber bundle) which segments the photoelectronic conversion element into the plurality of detection regions D1 to D8 and which transmits light from each of the detection regions D1 to D8, and a plurality of photodetectors (photomultiplier tubes) which convert light of each of the detection regions D1 to D8 transmitted from the optical transmission line into an electric signal. The segmented detector 30 outputs a signal in accordance with an intensity (a signal amount) of a detected electron beam (signal) for each of the detection regions D1 to D8. The output signal of the segmented detector 30 is subjected to predetermined processes (A/D conversion, amplification, and the like) by the controller 40 and then sent to the processing unit 50.

The aperture for aberration measurement 32 is disposed above the segmented detector 30 (the detector plane 302). The aperture for aberration measurement 32 is configured to be movable and, for example, disposed above the segmented detector 30 when photographing a STEM image in order to measure an aberration and disposed at a retracted position (outside of a path of an electron beam) when photographing a STEM image for normal observation of the specimen S. The aperture for aberration measurement 32 limits a region to which an electron beam is incident on the detection regions D1 to D8 of the segmented detector 30.

Figure 3:
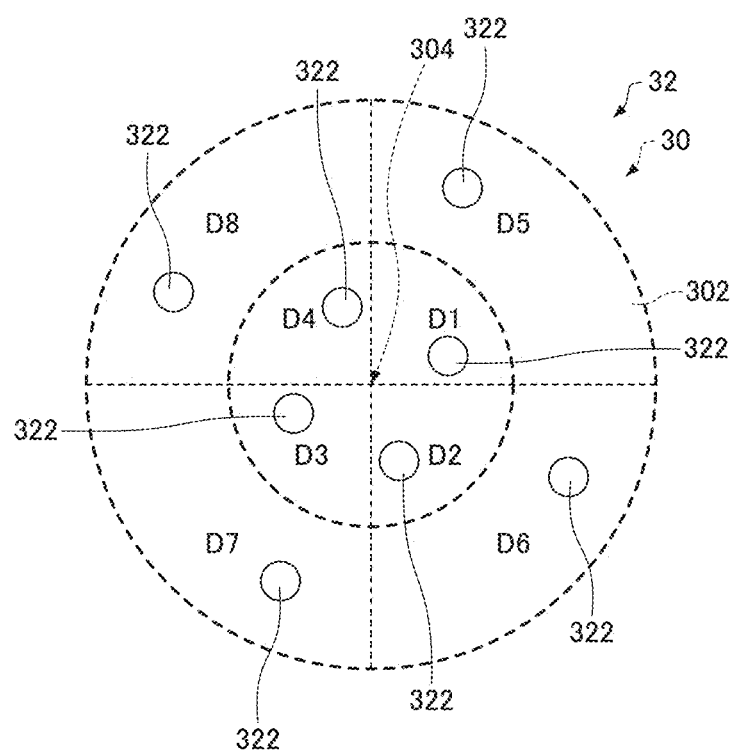
FIG. 3 is a diagram schematically illustrating a state where an aperture for aberration measurement is disposed above a segmented detector.

FIG. 3 is a diagram schematically illustrating a state where the aperture for aberration measurement 32 is disposed above the segmented detector 30. It should be noted that FIG. 3 is a view of the aperture for aberration measurement 32 from a direction of incidence of an electron beam.

The aperture for aberration measurement 32 has a plurality of aperture holes 322. Each aperture hole 322 is provided in correspondence to the detection regions D1 to D8. In the example shown in FIG. 3, eight aperture holes 322 are provided in one-to-one correspondence to the detection regions D1 to D8. A size (an area of an opening) of the aperture hole 322 is smaller than a size (an area) of the corresponding detection regions D1 to D8. In each detection region D1 to D8, only electrons having passed through the corresponding aperture hole 322 is detected. In other words, a region on which electrons of each of the detection regions D1 to D8 are incident can be limited by the aperture hole 322. Accordingly, for example, resolution in a direction of a deflection angle can be improved.

It should be noted that, in the segmented detector 30, while the resolution in the direction of a deflection angle improves as the size of the aperture hole 322 decreases, an SN ratio declines due to a decrease in a detected signal amount. Therefore, the size of the aperture hole 322 is appropriately set in accordance with the required resolution and SN ratio.

When the aperture for aberration measurement 32 has N-number of aperture holes 322 corresponding to N-number of detection regions disposed on an m-th (m=1, 2, . . . , M) layer from a center of the detector plane 302, the aperture holes 322 are provided in 360/N-degree intervals. For instance, in the example shown in FIG. 3, four aperture holes 322 corresponding to the four detection regions D1 to D4 disposed on a first layer are provided in 90-degree (360/4-degree) intervals. In a similar manner, on a second layer, four aperture holes 322 corresponding to the four detection regions D5 to D8 are provided in 90-degree intervals.

In addition, a disposition in the direction of a deflection angle of the N-number of aperture holes 322 corresponding to the N-number of detection regions disposed on the m-th layer from the center (an axis 304) of the detector plane 302 represents a 180/N-degree rotation of a disposition in the direction of a deflection angle of the N-number of aperture holes 322 corresponding to the N-number of detection regions disposed on a m−1-th layer from the center of the detector plane 302. For instance, in the example shown in FIG. 3, a disposition in the direction of a deflection angle of the four aperture holes 322 corresponding to the four detection regions D5 to D8 disposed on the second layer represents a 45-degree (180/4-degree) rotation of a disposition in the direction of a deflection angle of the four aperture holes 322 corresponding to the four detection regions D1 to D4 disposed on the first layer. When a boundary between the detection region D1 and the detection region D2 is assumed to be at 0 degrees, the four aperture holes 322 corresponding to the four detection regions D5 to D8 are respectively disposed at 65 degrees, 155 degrees, 245 degrees, and 335 degrees, and the four aperture holes 322 corresponding to the four detection regions D1 to D4 are respectively disposed at 20 degrees, 110 degrees, 200 degrees, and 290 degrees.

It should be noted that the number and disposition of the aperture holes 322 in the aperture for aberration measurement 32 are not limited to the example described above. The number and disposition of the aperture holes 322 in the aperture for aberration measurement 32 are determined according to a type of aberration to be measured.

By detecting an electron beam having passed through the specimen S with the segmented detector 30 in a state where the aperture for aberration measurement 32 is inserted, a STEM image obtained in each of the detection regions D1 to D8 of the segmented detector 30 becomes an image obtained with an electron beam with a different incidence angle and a different azimuth with respect to the specimen S. In other words, using the aperture for aberration measurement 32 and the segmented detector 30 enables a plurality of STEM images obtained by electron beams with a different incidence angle and a different azimuth with respect to the specimen S to be acquired at the same time.

In this case, the incidence angle of an electron beam with respect to the specimen S may also be referred to as a convergence angle of an electron beam incident on the specimen S. In addition, the incidence angle of an electron beam with respect to the specimen S is a tilt angle of the electron beam with respect to an optical axis 202 of the objective lens 20.

In the electron microscope 100, an aberration of the objective lens 20 (the illumination system) can be measured using a STEM image of each of the detection regions D1 to D8 obtained using the segmented detector 30 and the aperture for aberration measurement 32. This aberration measurement method will be described later.

The controller 40 is a device for controlling the various parts (the optical system, the specimen stage 22, and the like described above) which constitute the electron microscope 100. The controller 40 controls the various parts which constitute the electron microscope 100 based on, for example, a control signal from a control unit 52.

The operating unit 60 performs a process of acquiring an operation signal that corresponds to an operation performed by a user and sending the operation signal to the processing unit 50. For example, the operating unit 60 is a button, a key, a touch panel display, a microphone, or the like.

The display unit 62 displays an image generated by the processing unit 50 and a function thereof can be implemented by an LCD, a CRT, or the like.

The storage unit 64 stores programs, data, and the like that cause or allow the processing unit 50 to perform various calculation processes and control processes. In addition, the storage unit 64 is used as a work area for the processing unit 50, and temporarily stores the results of calculations and the like performed by the processing unit 50 according to various programs. A function of the storage unit 64 can be implemented by a memory (a storage device) such as a hard disk or a RAM.

The processing unit 50 performs various control processes, calculation processes, and the like according to the programs stored in the storage unit 64. The processing unit 50 functions as the control unit 52, an image generating unit 54, and an aberration measuring unit 56 to be described below by executing the programs stored in the storage unit 64. Functions of the processing unit 50 can be implemented by having various processors (a CPU, DSP, and the like) execute the programs. It should be noted that at least part of the functions of the processing unit 50 may be realized by a dedicated circuit such as an ASIC (a gate array or the like). The processing unit 50 includes the control unit 52, the image generating unit 54, and the aberration measuring unit 56.

The control unit 52 performs a process of generating a control signal for controlling each part constituting the electron microscope 100. For example, the control unit 52 performs a process of generating a control signal in accordance with a command by the user issued via the operating unit 60 and sending the control signal to the controller 40.

The image generating unit 54 performs a process of generating a STEM image based on an output signal of the segmented detector 30. The image generating unit 54 generates a STEM image for each of the detection regions D1 to D8 of the segmented detector 30.

The aberration measuring unit 56 performs a process of measuring an aberration of the objective lens 20 (the illumination system). Details of the process by the aberration measuring unit 56 will be described later.

1.2. Aberration Measurement Method

Next, an aberration measurement method according to the first embodiment will be described. The aberration measurement method according to the first embodiment is an aberration measurement method for the objective lens 20 (the illumination system) in the electron microscope 100.

Figure 4:
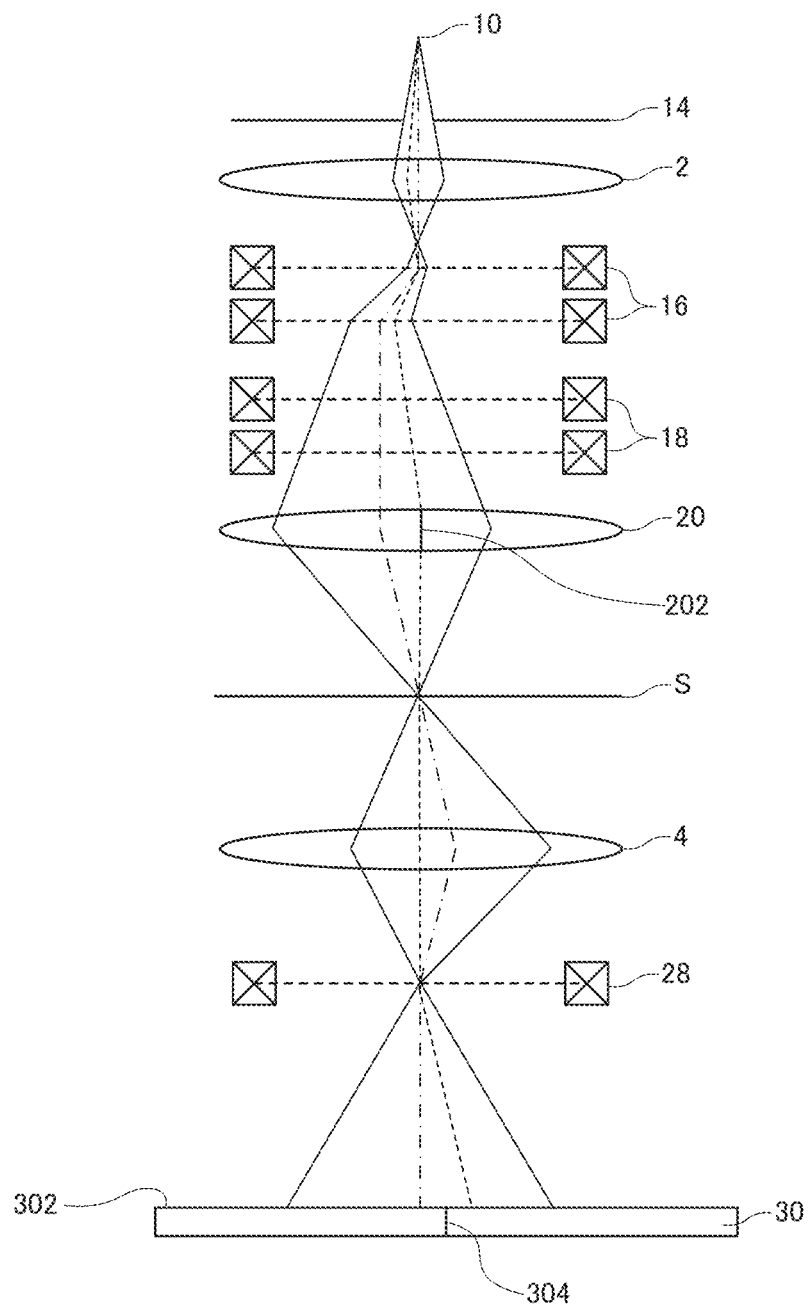
FIG. 4 is a diagram for explaining operations of the electron microscope according to the first embodiment.

FIG. 4 is a diagram for explaining operations of the electron microscope 100 according to the first embodiment. It should be noted that, in FIG. 4, for the sake of convenience, a lens group (including the illumination system lens 12) which constitutes the illumination system is depicted as an illumination system complex lens 2 and a lens group (including the intermediate lens 24 and the projector lens 26) which constitutes the imaging system is depicted as an imaging system complex lens 4. In addition, FIG. 4 illustrates how an electron beam is being tilted by the illumination system deflector 16. Furthermore, in FIG. 4, a path of an electron beam passing through the optical axis 202 of the objective lens 20 is represented by a dashed line and a path of a principal ray of the electron beam is indicated by a dot-and-dash line.

The illumination system aperture 14, the illumination system complex lens 2, the illumination system deflector 16, the scanning coil 18, and the objective lens 20 are disposed above the objective lens 20 from the side of the electron source 10. By deflecting an electron beam with the illumination system deflector 16, a tilt angle of the electron beam with respect to the optical axis 202 of the objective lens 20 (an incidence angle of the electron beam with respect to the specimen S) can be changed. Therefore, in the electron microscope 100, the specimen S can be scanned while tilting an electron beam with respect to the optical axis 202 of the objective lens 20.

The aperture for aberration measurement 32 is disposed above the segmented detector 30. Therefore, in the electron microscope 100, a STEM image can be formed by selecting a part of a transmitted wave disk (a Ronchigram) in a STEM mode.

Figure 5:
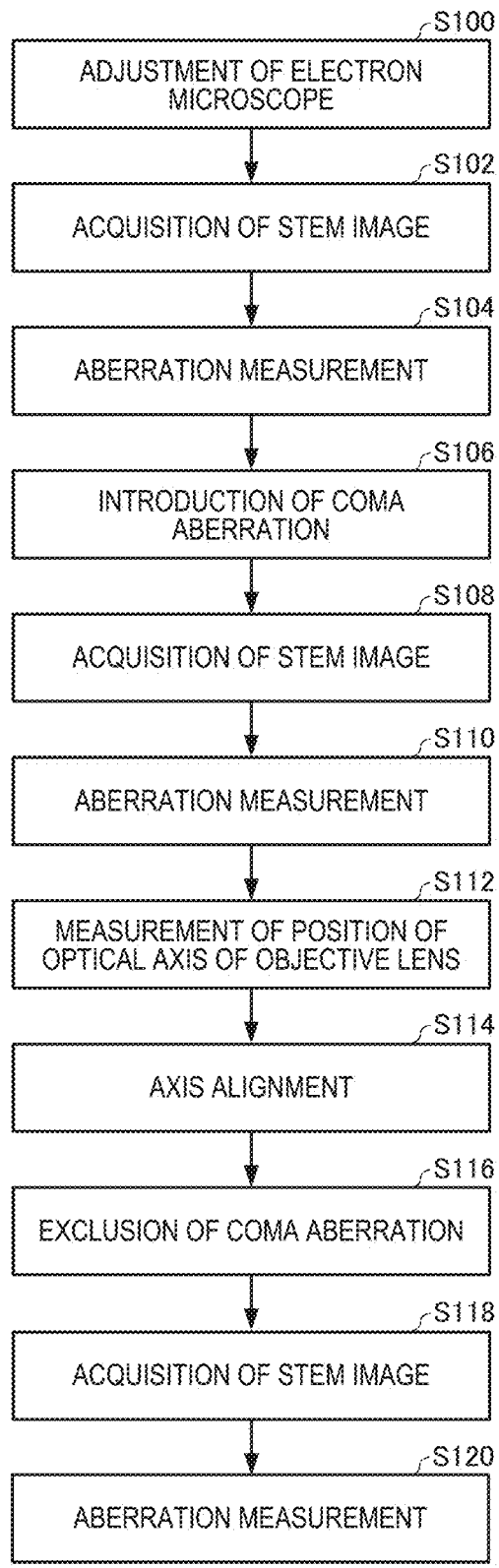
FIG. 5 is a flow chart illustrating an example of an aberration measurement method according to the first embodiment.

FIG. 5 is a flow chart illustrating an example of the aberration measurement method according to the first embodiment.

(1) Adjustment of Electron Microscope (S100)

Adjustments of the illumination system and the imaging system, adjustments of a gain and an offset of the segmented detector 30, an adjustment of a camera length of the imaging system, insertion of the aperture for aberration measurement 32, and the like are performed to set the electron microscope 100 in a condition where a STEM image can be acquired using the aperture for aberration measurement 32 and the segmented detector 30.

In this case, as shown in FIG. 4, the optical axis 202 of the objective lens 20 and the axis 304 of the segmented detector 30 are not aligned with each other. In other words, it is assumed that an axial disagreement has occurred between the optical axis 202 of the objective lens 20 and the axis 304 of the segmented detector 30.

In this case, the optical axis 202 of the objective lens 20 is a straight line which passes through a center and a focal point of the lens. The axis 304 of the segmented detector 30 is, for example, a center of the detector plane 302 of the segmented detector 30. The axis 304 of the segmented detector 30 is a position that becomes a coordinate origin when calculating an aberration.

(2) Acquisition of STEM Image (S102)

A STEM image is acquired for each of the detection regions D1 to D8 of the segmented detector 30. For example, a sharply defined target (a particle, a pore, or the like) is searched in the specimen S and a STEM image is acquired so that the target fits within a field of view. The STEM image is acquired using the segmented detector 30 and the aperture for aberration measurement 32. A magnification (a scanning magnification) of the STEM image is to be set to a magnification at which an image shift due to a geometrical aberration can be detected.

(3) Measurement of Aberration (S104)

An aberration of the objective lens 20 (the illumination system) is calculated from an image shift (a geometrical aberration) of the STEM image acquired for each of the detection regions D1 to D8. By sufficiently reducing a hole diameter of the aperture hole 322 of the aperture for aberration measurement 32, each STEM image can be approximated to an image acquired using an electron beam with a single incidence angle. In other words, an aberration can be calculated on the assumption that each obtained STEM image is obtained by an ideal detector plane with an infinitesimal detection area.

A method of measuring an aberration from the STEM image of each of the detection regions D1 to D8 will now be described.

An amount of image shift when a general aberration is present can be expressed as, for example, expression (1) below. In expression (1), w represents a complex incidence angle with respect to the specimen S.

$$u = c_1\omega + a_1\overline{\omega} + \tfrac{2}{3}b_2\omega\overline{\omega} + \tfrac{1}{3}\overline{b}_2\omega^2 + a_2\overline{\omega}^2 + c_3\omega^2\overline{\omega} + \tfrac{3}{4}s_3\omega\overline{\omega}^2 + \tfrac{1}{4}\overline{s}_3\omega^3 + a_3\overline{\omega}^3 + \tfrac{3}{5}b_4\omega^2\overline{\omega}^2 + \tfrac{2}{5}\overline{b}_4\omega^3\overline{\omega} + \tfrac{1}{5}d_4\omega\overline{\omega}^3 + \tfrac{1}{5}\overline{d}_4\omega^4 + a_4\overline{\omega}^4 + c_5\omega^3\overline{\omega}^2 + a_5\overline{\omega}^5 + \ldots \quad (1)$$

For example, when it is conceivable that there is a residual first-order aberration coefficient ($b_1$, $a_1$), an aberration can be measured from the four STEM images obtained in the detection regions of one layer (for example, the detection regions D1 to D4 of the first layer shown in FIG. 3).

In addition, for example, when it is conceivable that there is a residual second-order aberration coefficient ($b_2$, $a_2$) in addition to the residual first-order aberration coefficient, an aberration can be measured from the eight STEM images obtained in the detection regions of two layers (for example, the detection regions D1 to D4 of the first layer and the detection regions D5 to D8 of the second layer shown in FIG. 3).

Increasing the number of layers of detection regions on the detector plane 302 of the segmented detector 30 enables higher-order aberrations ($c_3$, $s_3$, $a_3$, . . . ) to be further measured.

When there are a necessary number or more of STEM images to determine an aberration coefficient, measurement accuracy can be improved using a least-squares method or the like.

An aberration can be measured by constructing a four-dimensional data set by combining a detection position vector on the detector plane 302 with a two-dimensional image shift vector of the STEM image of each of the detection regions D1 to D8 and calculating an aberration coefficient by the least-squares method. In this case, a coordinate origin of the detection position vector on the detector plane 302 is to be a position of the axis 304 of the segmented detector 30.

(4) Introduction of Coma Aberration (S106)

Next, as shown in FIG. 4, an electron beam incident on the specimen S is tilted by the illumination system deflector 16. Accordingly, a coma aberration of the objective lens 20 changes (a coma aberration is introduced). In this case, the electron beam incident on the specimen S is simply tilted (in other words, the electron beam is tilted but not shifted). Accordingly, only the coma aberration can be changed (only a coma aberration can be introduced). Since the illumination system deflector 16 is constituted by a double deflection coil, the illumination system deflector 16 can simply tilt the electron beam.

It should be noted that, in a case where the electron beam moves significantly on the detector plane 302 of the segmented detector 30 due to deflection by the illumination system deflector 16, the electron beam is re-deflected by the imaging system deflector 28 when necessary.

(5) Acquisition of STEM Image (S108)

In a state where a coma aberration is introduced to the objective lens 20, a STEM image is acquired for each of the detection regions D1 to D8 of the segmented detector 30. The acquisition of the STEM image is performed in a similar manner to step S102 described earlier.

(6) Measurement of Aberration (S110)

Next, an aberration of the objective lens 20 is calculated from an image shift (a geometrical aberration) of the STEM image of each of the detection regions D1 to D8 acquired in step S108. The aberration measurement is performed in a similar manner to step S104 described earlier. In this manner, in the first embodiment, an aberration measurement is respectively performed before introducing a coma aberration to the objective lens 20 and after introducing the coma aberration to the objective lens 20.

(7) Measurement of Position of Optical Axis of Objective Lens (S112)

Next, based on measurement results of an aberration before and after introducing the coma aberration, a position of the optical axis 202 of the objective lens 20 on the detector plane 302 of the segmented detector 30 is obtained. In this case, the position of the optical axis 202 of the objective lens 20 on the detector plane 302 is a position of the optical axis 202 projected on the detector plane 302 which is a position where an apparent aberration is not generated in a STEM image obtained by detecting an electron beam at the position.

Since the change in the coma aberration is the only change in aberration in the objective lens 20 before and after the electron beam is tilted, when the aberration is calculated using the optical axis 202 of the objective lens 20, only the change in the coma aberration is to be measured from the STEM images before and after tilting the electron beam. On the other hand, in this case, since the optical axis 202 of the objective lens 20 and the axis 304 of the segmented detector 30 disagree with each other (in other words, coordinate origins when calculating angles disagree between the side of the objective lens 20 and the side of the segmented detector 30), when an aberration is calculated using the axis 304 of the segmented detector 30 as a reference, changes in a two-fold astigmatism and a defocus (hereinafter, also referred to as an "apparent two-fold astigmatism" and an "apparent defocus") are detected in addition to a change in the coma aberration from the STEM images before and after tilting the electron beam. Hereinafter, an apparent two-fold astigmatism and an apparent defocus will be explained using mathematical expressions.

Let us assume that a change in a coma aberration coefficient due to tilting of an electron beam is expressed by $\Delta P_3$ using the optical axis 202 of the objective lens 20 as a reference. An amount of change in a wave aberration $\chi$ due to a coma aberration is expressed by the following expression using a complex angle $\Omega = \alpha \times \exp(i\theta)$ that combines a convergence angle $\alpha$ (corresponding to an incidence angle) and an azimuth $\theta$ with each other.

$$\Delta \chi_{P_3}(\Omega) = Re\{\tfrac{1}{3}\Delta P_3 \Omega \overline{\Omega}^2\}$$

When measuring a change in the wave aberration using an axis 304 of the segmented detector 30 as a reference, an aberration calculation is to be performed in a coordinate system in which an origin of $\Omega$ is shifted by an amount corresponding to the axial disagreement ($d\Omega$). Accordingly, the electron beam having an incidence angle of $\Omega$ on the side of the objective lens 20 is handled as an electron beam having an incidence angle of $\Omega' = \Omega - d\Omega$ on the side of the segmented detector 30. The detected final wave aberration is expressed by the following expression when disregarding minute high-order terms.

$$\Delta \chi_{P_3}^{detector}(\Omega') = Re\{\tfrac{1}{3}\Delta P_3 (\Omega - d\Omega)\overline{(\Omega - d\Omega)}^2\}$$

$$\approx Re\{\tfrac{1}{3}\Delta P_3 \Omega \overline{\Omega}^2\} + Re\{-\tfrac{1}{3}\Delta P_3 \overline{\Omega}^2 d\Omega\} + Re\{-\tfrac{2}{3}\Delta P_3 \Omega \overline{\Omega} \overline{d\Omega}\}$$

In the expression given above, a first term represents a change in a coma aberration, a second term represents a change in an apparent two-fold astigmatism, and a third term represents a change in an apparent defocus. The convergence angle $\alpha$ and the azimuth $\theta$ are restored as variables as follows.

$$d\Omega = \alpha_d e^{i\theta_d}$$

As a result, the following expression is obtained.

$$\Delta \chi_{P_3}^{detector}(\alpha, \theta) \approx Re\{\tfrac{1}{3}\Delta P_3 \alpha^2 [\alpha e^{i\theta} - \alpha_d e^{i(2\theta - \theta_d)} - 2\alpha_d e^{i\theta_d}]\}$$

A geometrical aberration G is a vector quantity representing the wave aberration $\chi$ differentiated by the convergence angle $\alpha$ and the azimuth $\theta$. By differentiating the expression given above by the convergence angle $\alpha$ on a coordinate having the axis 304 of the segmented detector 30 as a coordinate origin and the azimuth $\theta$, a change in the geometrical aberration (including apparent aberration components) due to the introduction of a coma aberration of the objective lens 20 is obtained.

$$\Delta G_{P_3}^{detector}(\alpha, \theta) \approx \frac{\lambda}{2\pi} \begin{pmatrix} \dfrac{\partial \Delta \chi_{P_3}^{detector}}{\partial \alpha} \\ \dfrac{1}{\alpha}\dfrac{\partial \Delta \chi_{P_3}^{detector}}{\partial \theta} \end{pmatrix}$$

As described above, a change in an aberration before and after tilting an electron beam as calculated from each STEM image is a sum of a change in a coma aberration component and a change in an apparent aberration component. However, when a detection point is present at a position where a shift in the coordinate origin due to an axial disagreement between the optical axis 202 of the objective lens 20 and the axis 304 of the segmented detector 30 is canceled, the apparent aberration disappears and only a change in the coma aberration component is detected at the detection point. This detection point corresponds to a position of the optical axis 202 of the objective lens 20 projected on the detector plane 302 and a magnitude of a change in the apparent aberration has a local minimum value (zero) at the detection point. The apparent aberration disappears when the axis 304 of the segmented detector 30 and the detection point (a local minimum point) having the local minimum value are aligned with each other.

In order to identify the local minimum point, a three-dimensional curved surface is plotted in which a detection position vector on the detector plane 302 of the segmented detector 30 is represented by xy coordinates and an absolute value of a change in an apparent aberration is represented by a z coordinate. In addition, in consideration of noise in actually-measured data, a local minimum point at which the change in the apparent aberration has a local minimum value is searched using a least-squares method. As described above, by identifying a local minimum point, a position of the optical axis 202 of the objective lens 20 on the detector plane 302 can be identified.

(8) Axis Alignment (S114)

Next, the optical axis 202 of the objective lens 20 and the axis 304 of the segmented detector 30 are aligned with each other (axis alignment). Specifically, an electron beam incident on the detector plane 302 of the segmented detector 30 is deflected using the imaging system deflector 28 and the identified position of the local minimum point is aligned with the axis 304 of the segmented detector 30. Accordingly, the optical axis 202 of the objective lens 20 and the axis 304 of the segmented detector 30 can be aligned with each other.

(9) Exclusion of Coma Aberration (S116)

Next, the introduced coma aberration is excluded. Specifically, the tilt of the electron beam applied by the illumination system deflector 16 when introducing the coma aberration (step S106) is restored to its original state (a state prior to tilting the electron beam in step S106). In addition, when the electron beam has been re-deflected by the imaging system deflector 28, the electron beam is restored to its original state by deflecting the electron beam by the imaging system deflector 28 in an opposite direction in a same amount as the amount of re-deflection.

(10) Acquisition of STEM Image (S118)

Next, a STEM image is acquired for each of the detection regions D1 to D8 of the segmented detector 30. The acquisition of the STEM image is performed in a similar manner to step S102 described earlier.

(11) Aberration Measurement (S120)

Next, an aberration of the objective lens 20 is calculated from the STEM image of each of the detection regions D1 to D8 acquired in step S118. The aberration measurement is performed in a similar manner to step S104. In this case, since the optical axis 202 of the objective lens 20 and the axis 304 of the segmented detector 30 are aligned with each other (the axial disagreement has been corrected), the aberration of the objective lens 20 can be measured accurately.

1.3. Operations of Electron Microscope

Figure 6:
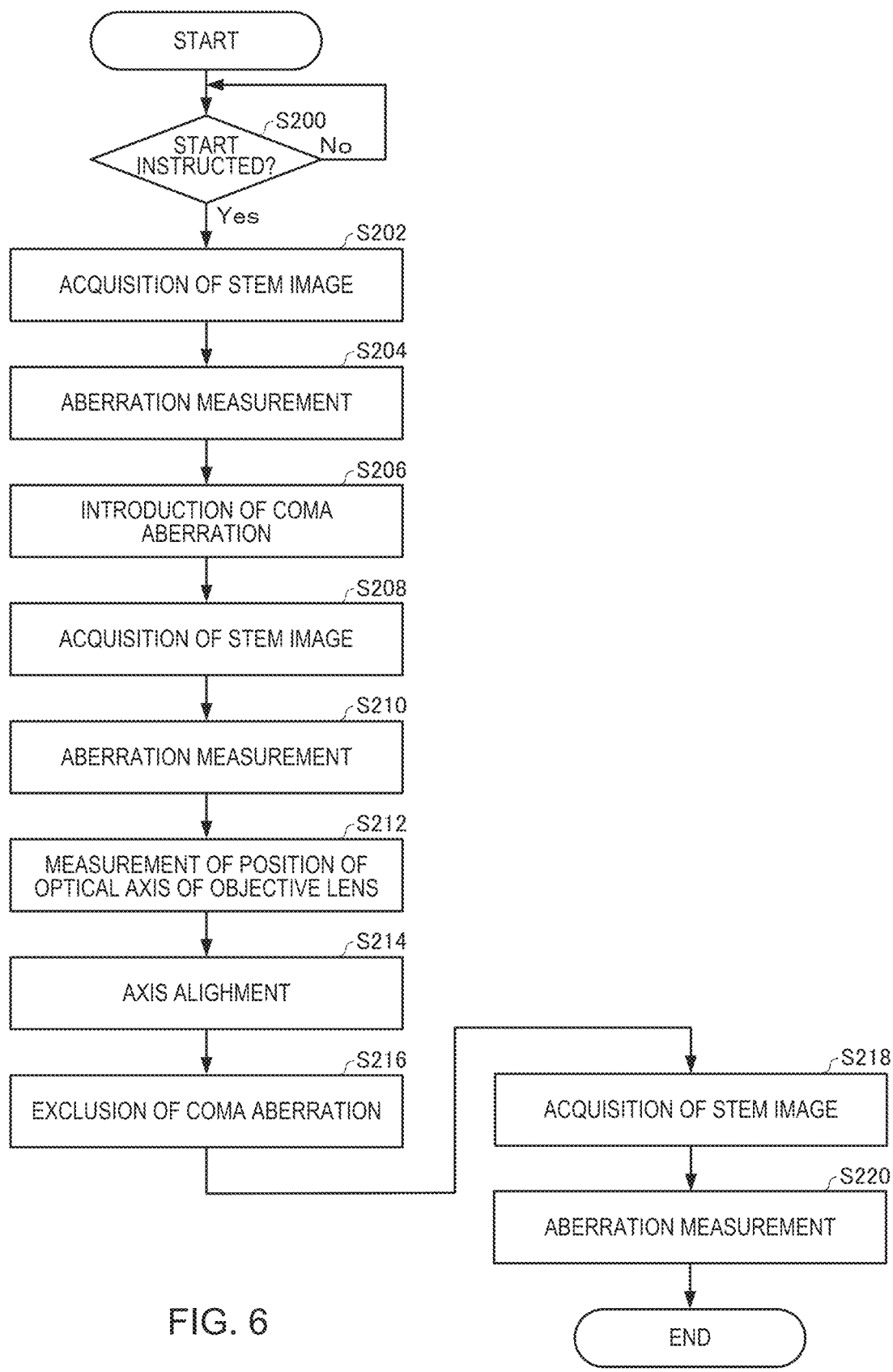
FIG. 6 is a flow chart illustrating an example of a flow of processes by a processing unit in the electron microscope according to the first embodiment.

In the electron microscope 100, the measurement of an aberration by the aberration measurement method described above can be performed automatically. FIG. 6 is a flow chart illustrating an example of a flow of processes by the processing unit 50 (the aberration measuring unit 56) of the electron microscope 100. It is assumed that the aperture for aberration measurement 32 has been inserted into the electron microscope 100 and the electron microscope 100 is capable of acquiring STEM images using the segmented detector 30.

First, the aberration measuring unit 56 determines whether or not the user has issued an instruction (a start instruction) to start an aberration measurement (S200), and stands by until a start instruction is issued (No in S200). For example, the aberration measuring unit 56 determines that the user has issued a start instruction when the start instruction is input via the operating unit 60.

When the aberration measuring unit 56 determines that a start instruction has been issued (Yes in S200), the aberration measuring unit 56 controls the optical system (the scanning coil 18 and the like) of the electron microscope 100 via the control unit 52 and acquires a STEM image of each of the detection regions D1 to D8 generated by the image generating unit 54 (S202).

Next, the aberration measuring unit 56 calculates an aberration of the objective lens 20 from an image shift (a geometrical aberration) of the acquired STEM image of each of the detection regions D1 to D8 (S204). A method of calculating the aberration is as described earlier in step S104.

Next, the aberration measuring unit 56 operates the illumination system deflector 16 via the control unit 52 to simply tilt an electron beam incident on the specimen S (S206). Accordingly, a coma aberration is introduced to the objective lens 20.

Next, the aberration measuring unit 56 controls the optical system (the scanning coil 18 and the like) of the electron microscope 100 via the control unit 52 and acquires a STEM image of each of the detection regions D1 to D8 generated by the image generating unit 54 (S208).

Next, the aberration measuring unit 56 calculates an aberration of the objective lens 20 from an image shift (a geometrical aberration) of the STEM image of each of the detection regions D1 to D8 acquired in step S208 (S210). The calculation of the aberration is performed in a similar manner to step S204 described earlier.

Next, based on measurement results of the aberration before and after introducing the coma aberration, the aberration measuring unit 56 obtains a position of the optical axis 202 of the objective lens 20 on the detector plane 302 of the segmented detector 30 (S212). The aberration measuring unit 56 searches for a position (a local minimum point) where an amount of change in an apparent aberration has a local minimum value on the detector plane 302 from the measurement results of the aberration before and after introducing the coma aberration, and adopts the local minimum point as the position of the optical axis 202 of the objective lens 20 on the detector plane 302.

Next, the aberration measuring unit 56 aligns the optical axis 202 of the objective lens 20 and the axis 304 of the segmented detector 30 with each other (S214). For example, the aberration measuring unit 56 operates the imaging system deflector 28 via the control unit 52 to deflect an electron beam incident on the segmented detector 30 and aligns the identified position of the optical axis 202 of the objective lens 20 with the axis 304 of the segmented detector 30.

Next, the aberration measuring unit 56 operates the illumination system deflector 16 via the control unit 52 to restore the tilt of the electron beam applied by the illumination system deflector 16 when introducing the coma aberration to its original state (a state prior to tilting the electron beam in step S206) to exclude the introduced coma aberration (S216).

Next, the aberration measuring unit 56 acquires the STEM image of each of the detection regions D1 to D8 (S218), and calculates an aberration of the objective lens 20 from the acquired STEM image of each of the detection regions D1 to D8 (S220). The acquisition of STEM images and the measurement of the aberration are respectively performed in a similar manner to steps S202 and S204. For example, the aberration measuring unit 56 performs control to have the display unit 62 display a measurement result of the aberration. In addition, the aberration measuring unit 56 may operate an aberration correction device (not illustrated) based on the measurement result of the aberration. Subsequently, the aberration measuring unit 56 ends the process.

1.4. Features

For example, the aberration measurement method according to the first embodiment has the following features.

The aberration measurement method according to the first embodiment of the invention includes the steps of: introducing a coma aberration to the objective lens 20; measuring an aberration of the objective lens 20 before the step of introducing the coma aberration to the objective lens 20; measuring an aberration of the objective lens 20 after the step of introducing the coma aberration to the objective lens 20; and obtaining a position of the optical axis 202 of the objective lens 20 on the detector plane 302 of the segmented detector 30 based on measurement results of an aberration before and after introducing the coma aberration. Therefore, with the aberration measurement method according to the first embodiment, since a position of the optical axis 202 of the objective lens 20 on the detector plane 302 can be obtained based on a change in an apparent aberration before and after introducing the coma aberration to the objective lens 20, the position can be readily and accurately obtained.

Figure 21:
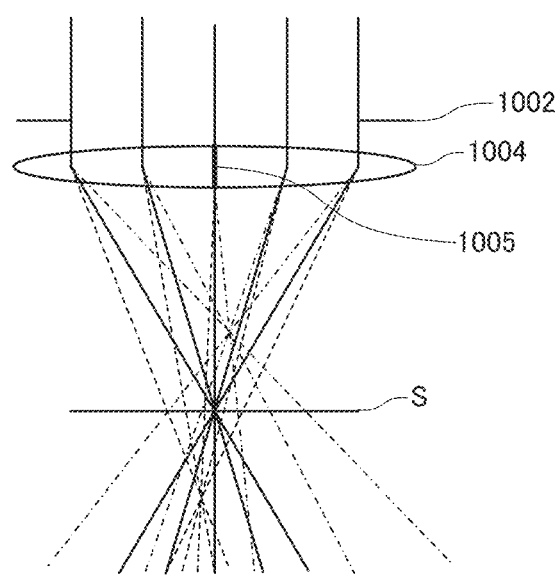
FIG. 21 is a diagram for explaining an image shift due to an axial disagreement between an optical axis of an objective lens and an objective current center of the objective lens.

For example, when measuring a position of the optical axis 202 of the objective lens 20 on the detector plane 302, using STEM images before and after changing a defocus of the objective lens 20 causes an image shift due to an apparent aberration and an image shift (refer to FIG. 21) attributable to a disagreement of an objective current center to be created on the STEM images. These image shifts cannot be separated and makes it difficult to accurately obtain the position of the optical axis 202 of the objective lens 20 on the detector plane 302.

Conversely, when measuring the position of the optical axis 202 of the objective lens 20 on the detector plane 302, using STEM images before and after introducing the coma aberration to the objective lens 20 enables a coma aberration to be introduced by tilting an electron beam without changing an excitation of the objective lens 20 and, consequently, an image shift attributable to a disagreement of an objective current center is not created on the STEM images. Therefore, according to the first embodiment, the position of the optical axis 202 of the objective lens 20 on the detector plane 302 can be accurately obtained.

According to the first embodiment, as described above, since the position of the optical axis 202 of the objective lens 20 on the detector plane 302 can be obtained, a measurement of an aberration can be performed in a state where the optical axis 202 of the objective lens 20 and the axis 304 of the segmented detector 30 are aligned with each other. Therefore, an apparent aberration does not occur (or an effect of an apparent aberration can be reduced) and an aberration to be corrected can be accurately measured. As a result, an aberration of the objective lens 20 can be accurately measured.

In the aberration measurement method according to the first embodiment, in the step of obtaining the position of the optical axis 202 of the objective lens 20, a position where an amount of change in an apparent aberration has a local minimum value on the detector plane 302 is adopted as the position of the optical axis 202 of the objective lens 20 on the detector plane 302. Therefore, the position of the optical axis 202 of the objective lens 20 on the detector plane 302 can be readily and accurately obtained.

In the aberration measurement method according to the first embodiment, in the step of measuring the aberration of the objective lens 20 before the step of introducing the coma aberration to the objective lens 20 and in the step of measuring the aberration of the objective lens 20 after the step of introducing the coma aberration to the objective lens 20, an aberration is obtained from a STEM image of each of the detection regions D1 to D8 obtained using the aperture for aberration measurement 32. As a result, an aberration of the objective lens 20 can be accurately obtained. A reason therefor will be described below.

In the segmented detector 30, each of the detection regions D1 to D8 has a fan-like shape. In such detection regions D1 to D8, when a STEM image is acquired without using the aperture for aberration measurement 32, since a spread of each of the detection regions D1 to D8 is large (in other words, an angular range of an electron beam incident on each of the detection regions D1 to D8 is large), the image is blurred and an amount of shift of the image cannot be accurately calculated. In particular, in a detection region with a fan-like shape, since a spread in a direction of a deflection angle (a circumferential direction) is large, a blur of an image becomes prominent when an aberration with high-order symmetry in the direction of a deflection angle is present.

In the first embodiment, since the aperture for aberration measurement 32 is used, such a problem does not arise. For example, by reducing a diameter of the aperture hole 322 of the aperture for aberration measurement 32, a STEM image of each of the detection regions D1 to D8 can also be approximated to an image acquired using an electron beam with a single incidence angle. Therefore, according to the first embodiment, the aberration of the objective lens 20 can be accurately obtained from the STEM image of each of the detection regions D1 to D8.

In the aberration measurement method according to the first embodiment, in the step of introducing the coma aberration to the objective lens 20, the coma aberration is introduced by tilting an electron beam incident on the specimen S. Therefore, the position of the optical axis 202 of the objective lens 20 on the detector plane 302 can be readily and accurately obtained.

In the aberration measurement method according to the first embodiment, the illumination system deflector 16 has deflection elements disposed in multiple stages, and an electron beam incident on the specimen S is tilted using the illumination system deflector 16. As a result, the electron beam can be simply tilted. Therefore, only a coma aberration can be introduced to the objective lens 20.

The aberration measurement method according to the first embodiment includes, after the step of obtaining the position of the optical axis 202 of the objective lens 20 on the detector plane 302 of the segmented detector 30, the step of aligning the optical axis 202 of the objective lens 20 with the axis 304 of the segmented detector 30 based on the obtained position of the optical axis 202 of the objective lens 20 on the detector plane 302. Therefore, the measurement of an aberration can be performed in a state where the optical axis 202 of the objective lens 20 and the axis 304 of the segmented detector 30 are aligned with each other and the aberration of the objective lens 20 can be measured accurately.

In the aberration measurement method according to the first embodiment, in the step of aligning the optical axis 202 of the objective lens 20 with the axis 304 of the segmented detector 30, an electron beam is deflected by the imaging system deflector 28 based on the obtained position of the optical axis 202 of the objective lens 20 on the detector plane 302. Therefore, the measurement of an aberration can be performed in a state where the optical axis 202 of the objective lens 20 and the axis 304 of the segmented detector 30 are aligned with each other and the aberration of the objective lens 20 can be measured accurately.

The aberration measurement method according to the first embodiment includes, after the step of aligning the optical axis 202 of the objective lens 20 with the axis 304 of the segmented detector 30, the step of measuring an aberration of the objective lens 20. Therefore, according to the first embodiment, since an effect of an apparent aberration is reduced, an aberration of the objective lens 20 can be accurately measured.

In the electron microscope 100 according to the first embodiment, the aberration measuring unit 56 performs a process of obtaining a position of the optical axis 202 of the objective lens 20 on the detector plane 302 based on measurement results of an aberration before and after introducing a coma aberration to the objective lens 20. Therefore, in the electron microscope 100, an aberration of the objective lens 20 can be accurately measured.

1.5. Modification

Next, a modification of the electron microscope according to the first embodiment will be described with reference to the drawings. The following description will focus on points that differ from the example of the electron microscope 100 described above, and description of similar points will be omitted.

While a case where an electron beam incident on the detector plane 302 is deflected to align the optical axis 202 of the objective lens 20 and the axis 304 of the segmented detector 30 with each other (step S112 shown in FIG. 5) has been explained in the embodiment described above, for example, a result of an aberration measurement may be corrected based on a position of the optical axis 202 of the objective lens 20 on the detector plane 302 when calculating an aberration.

Figure 7:
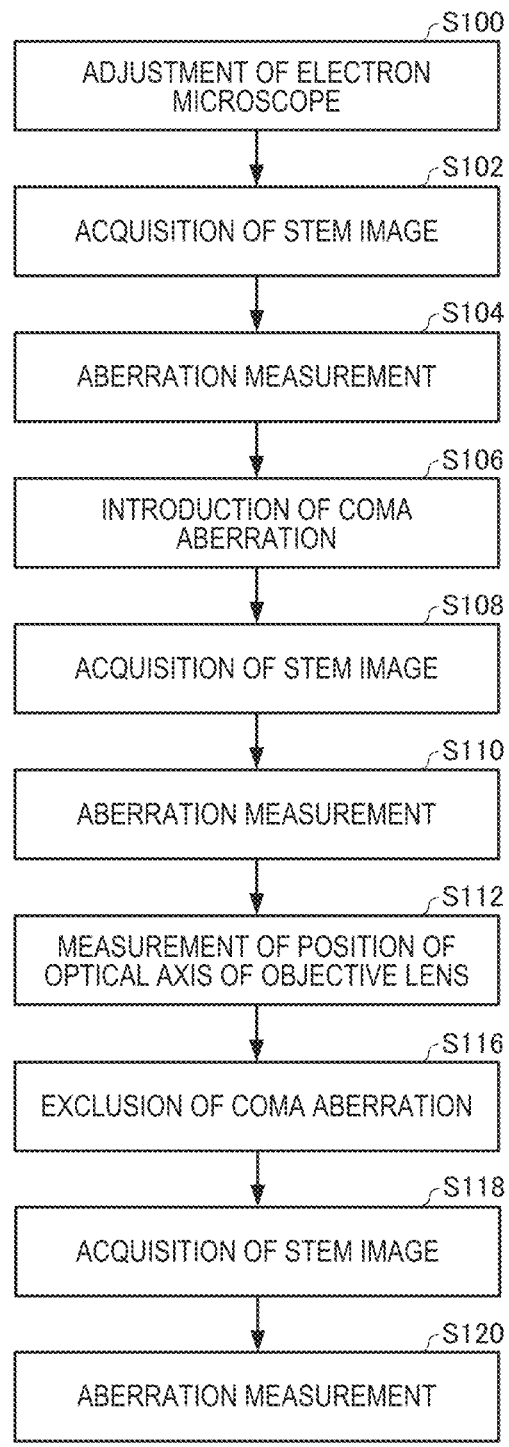
FIG. 7 is a flow chart illustrating a modification of the aberration measurement method according to the first embodiment.

FIG. 7 is a flow chart illustrating a modification of the aberration measurement method according to the first embodiment.

As shown in FIG. 7, in this modification, the step of aligning the optical axis 202 of the objective lens 20 and the axis 304 of the segmented detector 30 with each other (step S114 shown in FIG. 5) is not performed. In this modification, after the step of measuring the position of the optical axis 202 of the objective lens 20 on the detector plane 302 (S112), a STEM image of each of the detection regions D1 to D8 is acquired (S118) and a measurement of an aberration of the objective lens 20 is performed (S120). When performing the aberration measurement, a measurement result of the aberration of the objective lens 20 is corrected based on the position of the optical axis 202 of the objective lens 20 on the detector plane 302. Specifically, when calculating an aberration, a correction is applied so that an origin of a wave number space is aligned with a local minimum point where a change in an apparent aberration has a local minimum value. Accordingly, an apparent aberration does not appear in a result of an aberration calculation.

According to this modification, a similar working effect to that of the embodiment described above can be produced. It should be noted that the process of this modification may be performed by the aberration measuring unit 56.

2. Second Embodiment

2.1. Electron Microscope

Figure 8:
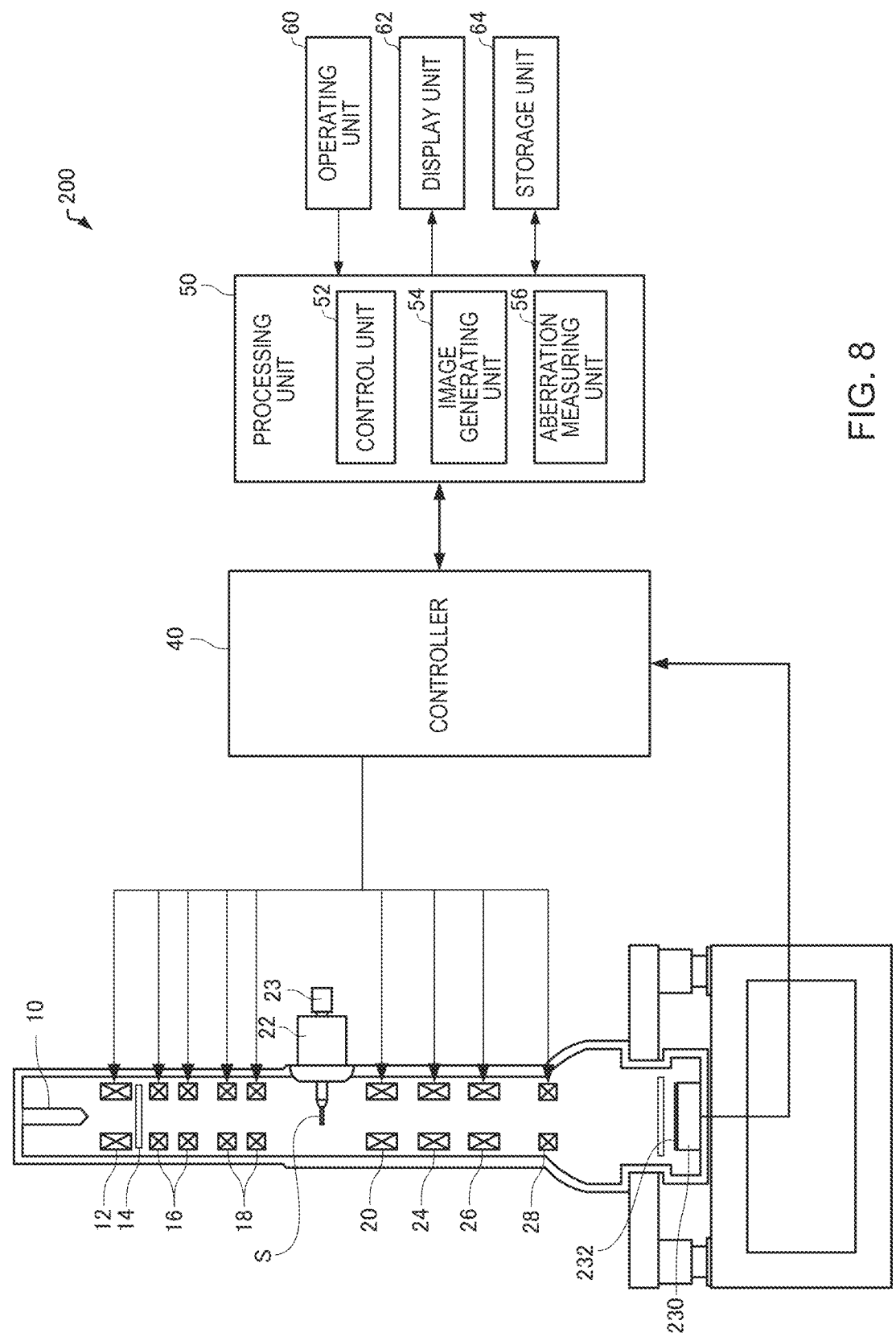
FIG. 8 is a diagram illustrating a configuration of an electron microscope according to a second embodiment.

Next, an electron microscope according to a second embodiment will be described with reference to the drawings. FIG. 8 is a diagram illustrating a configuration of an electron microscope 200 according to the second embodiment. Hereinafter, in the electron microscope 200 according to the second embodiment, members having similar functions to the components of the electron microscope 100 according to the first embodiment will be denoted by same reference characters and a detailed description thereof will be omitted.

As shown in FIG. 1, the electron microscope 100 described above is provided with a segmented detector 30 as a detector which detects an electron beam having passed through the specimen S.

Conversely, as shown in FIG. 8, the electron microscope 200 is provided with a solid-state imaging element 230 as a detector which detects an electron beam having passed through the specimen S.

The solid-state imaging element 230 has a detector plane 232 on which a plurality of light receiving elements are arranged. For example, the solid-state imaging element 230 is a digital camera such as a charge-coupled device (CCD) camera or a complementary metal oxide semiconductor (CMOS) camera.

The aberration measuring unit 56 calculates an aberration of the objective lens 20 by an aberration measurement method using a Ronchigram acquired by the solid-state imaging element 230.

2.2. Aberration Measurement Method

Next, an aberration measurement method according to the second embodiment will be described. The aberration measurement method according to the second embodiment is an aberration measurement method for the objective lens 20 (the illumination system) in the electron microscope 200. The following description will focus on points that differ from the example of the aberration measurement method according to the first embodiment described above, and description of similar points will be omitted.

Figure 9:
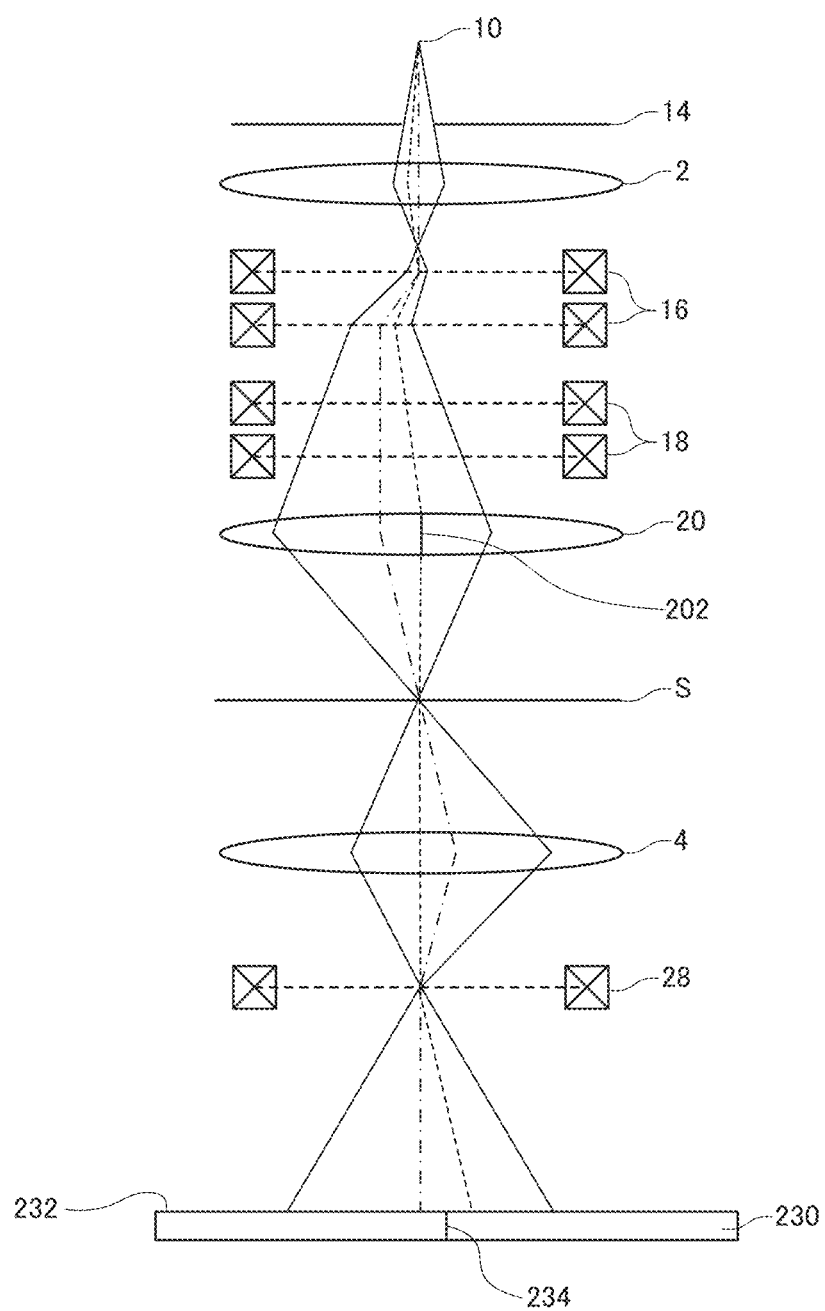
FIG. 9 is a diagram for explaining operations of the electron microscope according to the second embodiment.
Figure 10:
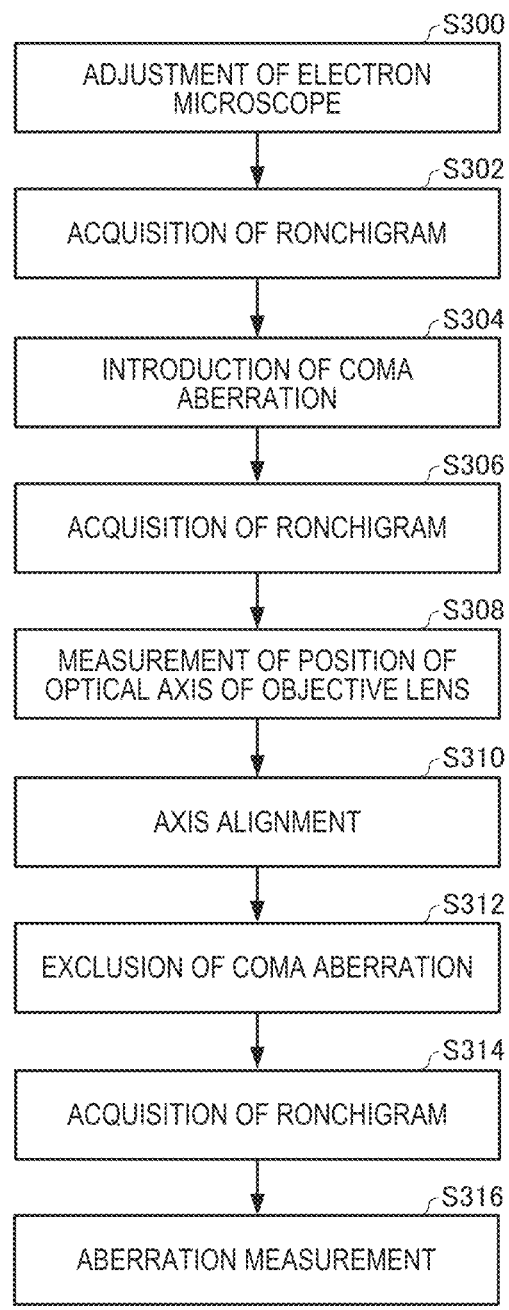
FIG. 10 is a flow chart illustrating an example of an aberration measurement method according to the second embodiment.

FIG. 9 is a diagram for explaining operations of the electron microscope 200 according to the second embodiment. It should be noted that FIG. 9 corresponds to FIG. 4. FIG. 10 is a flow chart illustrating an example of the aberration measurement method according to the second embodiment.

(1) Adjustment of Electron Microscope (S300)

A field of view is moved so that an amorphous region of the specimen S is included in the field of view. Subsequently, adjustments of the illumination system and the imaging system, adjustments of a camera length of the imaging system, and the like are performed to set the electron microscope 200 in a condition where a Ronchigram can be photographed.

In this case, as shown in FIG. 9, the optical axis 202 of the objective lens 20 and an axis 234 of the solid-state imaging element 230 are not aligned with each other. In other words, it is assumed that an axial disagreement has occurred between the optical axis 202 of the objective lens 20 and the axis 234 of the solid-state imaging element 230. The axis 234 of the solid-state imaging element 230 is a position that becomes a coordinate origin (a coordinate origin O) when calculating an aberration.

(2) Acquisition of Ronchigram (S302)

A Ronchigram is photographed by the solid-state imaging element 230. Specifically, an electron beam is focused on the amorphous region of the specimen S and an electron beam having passed through the specimen S is detected by the solid-state imaging element 230. In this case, by photographing a Ronchigram while changing focus, a plurality of Ronchigrams with different defocus amounts are acquired. Hereinafter, the plurality of Ronchigrams with different defocus amounts are also referred to as a data set DS1.

(3) Introduction of Coma Aberration (S304)

Next, as shown in FIG. 9, an electron beam incident on the specimen S is tilted by the illumination system deflector 16. Accordingly, a coma aberration of the objective lens 20 changes (a coma aberration is introduced). This step is performed in a similar manner to step S106 described earlier.

(4) Acquisition of Ronchigram (S306)

Next, a Ronchigram is photographed by the solid-state imaging element 230 in a state where the coma aberration has been introduced to the objective lens 20. This step is performed in a similar manner to step S302 described earlier. Accordingly, a plurality of Ronchigrams with different defocus amounts (hereinafter, also referred to as a "data set D$\Omega$") are acquired.

(5) Measurement of Position of Optical Axis of Objective Lens (S308)

Next, based on measurement results of an aberration before and after introducing the coma aberration, a position of the optical axis 202 of the objective lens 20 on the detector plane 232 of the solid-state imaging element 230 is obtained. In this case, the position of the optical axis 202 of the objective lens 20 on the detector plane 232 is a position of the optical axis 202 projected on the detector plane 232 which is a position where an apparent aberration is not generated in a STEM image obtained as a result of detecting an electron beam at the position.

Figure 11:
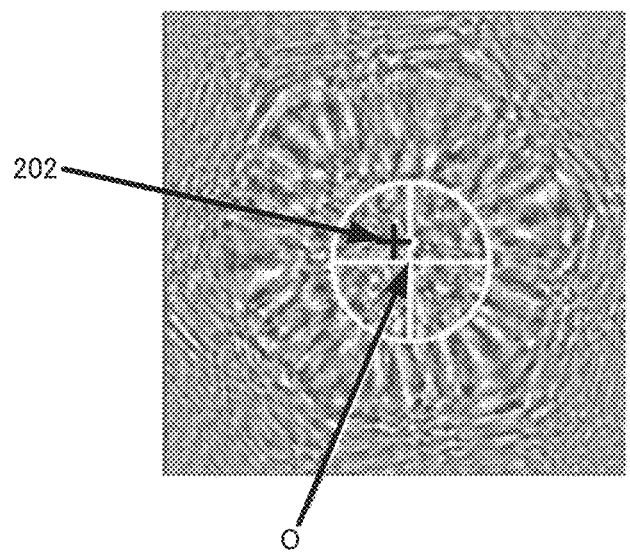
FIG. 11 is a diagram illustrating a position of an optical axis of an objective lens and a position of a coordinate origin of an aberration calculation on a Ronchigram.

FIG. 11 is a diagram illustrating a position of the optical axis 202 of the objective lens 20 and a position of the coordinate origin O of an aberration calculation on a Ronchigram.

As shown in FIG. 11, when there is a disagreement between the position of the optical axis 202 of the objective lens 20 and a position of the coordinate origin of an aberration calculation, as described earlier, a change in an apparent aberration (a two-fold astigmatism and a defocus) other than the coma aberration is detected. A position of the coordinate origin O when the detected change in aberration is only a coma aberration component corresponds to the position of the optical axis 202 of the objective lens 20 on the detector plane 232.

Specifically, an aberration calculation is repetitively performed on the data set DS1 and the data set DS2 while changing the position of the coordinate origin O in an angle space. In addition, a local minimum point where an amount of change in an apparent two-fold astigmatism and an amount of change in an apparent defocus become zero is searched by an iteration method or a least-squares method. In this manner, by identifying a local minimum point, a position of the optical axis 202 of the objective lens 20 on the detector plane 232 can be identified.

(6) Axis Alignment (S310)

Next, the optical axis 202 of the objective lens 20 and the coordinate origin O of an aberration calculation are aligned with each other (axis alignment). Specifically, an electron beam incident on the detector plane 232 of the solid-state imaging element 230 is deflected using the imaging system deflector 28 and the identified position of the local minimum point is aligned with the coordinate origin O. Accordingly, the optical axis 202 of the objective lens 20 and the coordinate origin O can be aligned with each other.

(7) Exclusion of Coma Aberration (S312)

Next, the introduced coma aberration is excluded. This step is performed in a similar manner to step S116 described earlier.

(8) Acquisition of Ronchigram (S314)

Next, a Ronchigram is photographed by the solid-state imaging element 230. This step is performed in a similar manner to step S302 described earlier. Accordingly, a plurality of Ronchigrams with different defocus amounts (hereinafter, also referred to as a "data set DS3") are acquired.

(9) Aberration Measurement (S316)

Next, a measurement of an aberration of the objective lens 20 is performed using the data set DS3. The aberration can be measured by obtaining a differential of a geometrical aberration from an auto-correlation function of a local area of the acquired Ronchigrams. In this case, since the optical axis 202 of the objective lens 20 and the position of the coordinate origin O are aligned with each other (the axial disagreement has been corrected), the aberration of the objective lens 20 can be measured accurately using the Ronchigrams.

2.3. Operations of Electron Microscope

Figure 12:
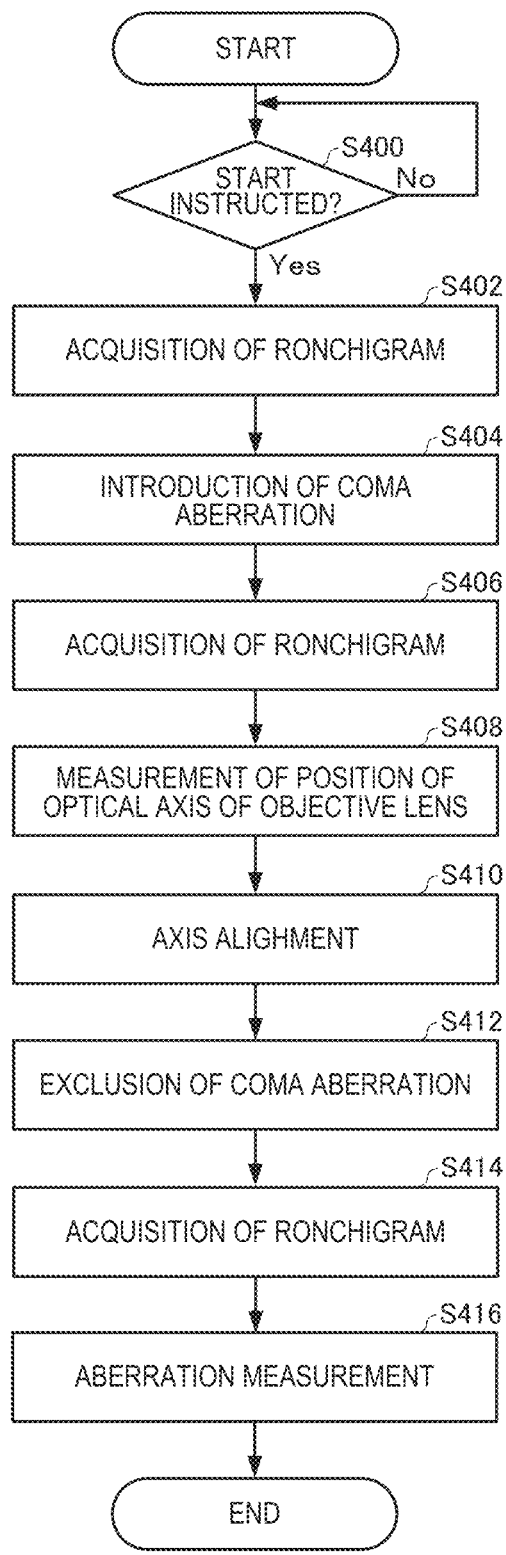
FIG. 12 is a flow chart illustrating an example of a flow of processes by a processing unit of the electron microscope according to the second embodiment.

In the electron microscope 200, the measurement of an aberration by the aberration measurement method described above can be performed automatically. FIG. 12 is a flow chart illustrating an example of a flow of processes by the processing unit 50 (the aberration measuring unit 56) of the electron microscope 200. It is assumed that the electron microscope 200 is capable of acquiring Ronchigrams using the solid-state imaging element 230.

First, the aberration measuring unit 56 determines whether or not the user has issued an instruction (a start instruction) to start an aberration measurement (S400), and stands by until a start instruction is issued (No in S400). For example, the aberration measuring unit 56 determines that the user has issued a start instruction when the start instruction is input via the operating unit 60.

When the aberration measuring unit 56 determines that a start instruction has been issued (Yes in S400), the aberration measuring unit 56 controls the optical system of the electron microscope 200 via the control unit 52 and acquires a Ronchigram generated by the image generating unit 54 (S402). In this case, by photographing a Ronchigram while changing focus, a plurality of Ronchigrams with different defocus amounts (the data set DS1) are acquired.

Next, the aberration measuring unit 56 operates the illumination system deflector 16 via the control unit 52 to tilt an electron beam incident on the specimen S (S404). Accordingly, a coma aberration is introduced to the objective lens 20.

Next, the aberration measuring unit 56 controls the optical system of the electron microscope 200 via the control unit 52 and acquires a Ronchigram generated by the image generating unit 54 (S406). In this case, by photographing a Ronchigram while changing focus, a plurality of Ronchigrams with different defocus amounts (the data set DS2) are acquired.

Next, based on measurement results of an aberration before and after introducing the coma aberration, the aberration measuring unit 56 obtains a position of the optical axis 202 of the objective lens 20 on the detector plane 232 of the solid-state imaging element 230 (S408).

Next, the aberration measuring unit 56 aligns the optical axis 202 of the objective lens 20 with the coordinate origin O of an aberration calculation (S410). For example, the aberration measuring unit 56 operates the imaging system deflector 28 via the control unit 52 to deflect an electron beam incident on the solid-state imaging element 230 and aligns the identified position of the optical axis 202 of the objective lens 20 with the coordinate origin O.

Next, the aberration measuring unit 56 operates the illumination system deflector 16 via the control unit 52 to restore the tilt of the electron beam applied by the illumination system deflector 16 when introducing the coma aberration to its original state (a state prior to tilting the electron beam in step S404) to exclude the introduced coma aberration (S412).

Next, the aberration measuring unit 56 acquires a Ronchigram (S414) and performs a measurement of the aberration of the objective lens 20 (S416). For example, the aberration measuring unit 56 performs control to have the display unit 62 display a measurement result of the aberration. In addition, the aberration measuring unit 56 may operate an aberration correction device (not illustrated) based on the measurement result of the aberration. Subsequently, the aberration measuring unit 56 ends the process.

2.4. Features

In the aberration measurement method according to the second embodiment, in the step of measuring the aberration of the objective lens 20 before the step of introducing the coma aberration to the objective lens 20 and in the step of measuring the aberration of the objective lens 20 after the step of introducing the coma aberration to the objective lens 20, an aberration is obtained from a Ronchigram acquired using the solid-state imaging element 230. Therefore, according to the second embodiment, a similar working effect to that of the first embodiment can be produced.

2.5. Modification

Next, a modification of the electron microscope according to the second embodiment will be described with reference to the drawings. The following description will focus on points that differ from the example of the electron microscope 200 described above, and description of similar points will be omitted.

While a case where an electron beam incident on the detector plane 232 is deflected to align the optical axis 202 of the objective lens 20 and the coordinate origin O with each other (step S310 shown in FIG. 10) has been explained in the embodiment described above, for example, a measurement result of an aberration of the objective lens 20 may be corrected based on a position of the optical axis 202 of the objective lens 20 on the detector plane 232 when calculating an aberration.

Figure 13:
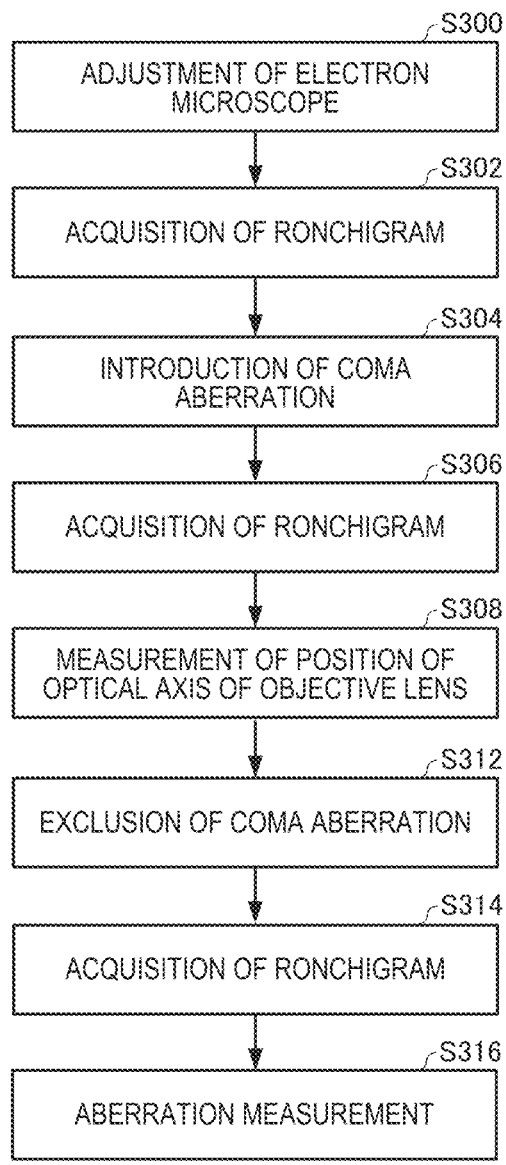
FIG. 13 is a flow chart illustrating a modification of the aberration measurement method according to the second embodiment.
Figure 14:
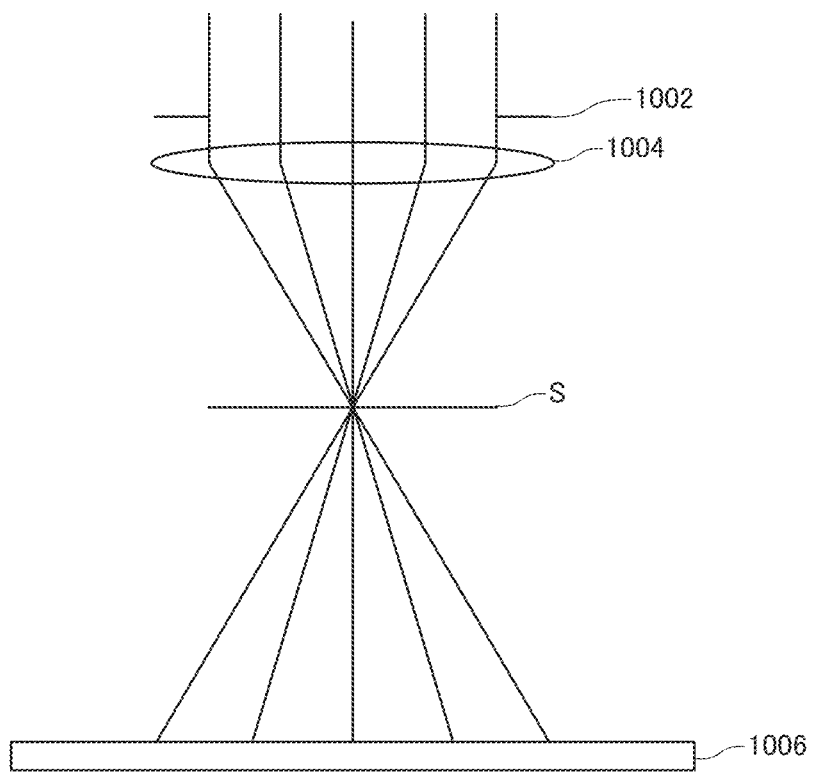
FIG. 14 is a diagram for explaining a measurement method of an aberration in a scanning transmission electron microscope.
Figure 15:
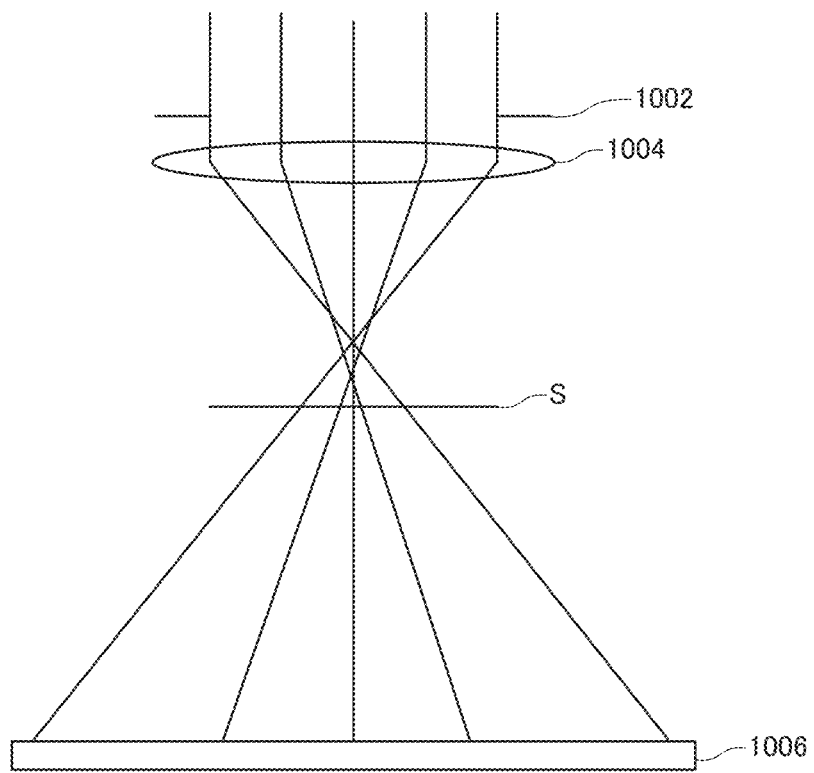
FIG. 15 is a diagram for explaining a measurement method of an aberration in a scanning transmission electron microscope.
Figure 16:
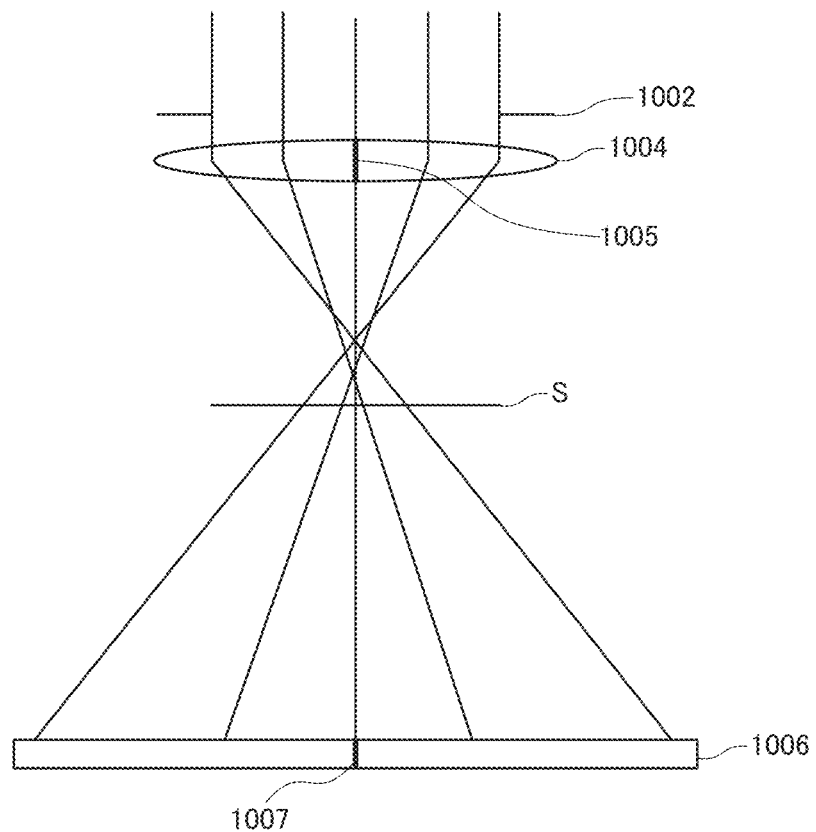
FIG. 16 is a diagram for explaining how an apparent aberration due to an axial disagreement occurs.
Figure 17:
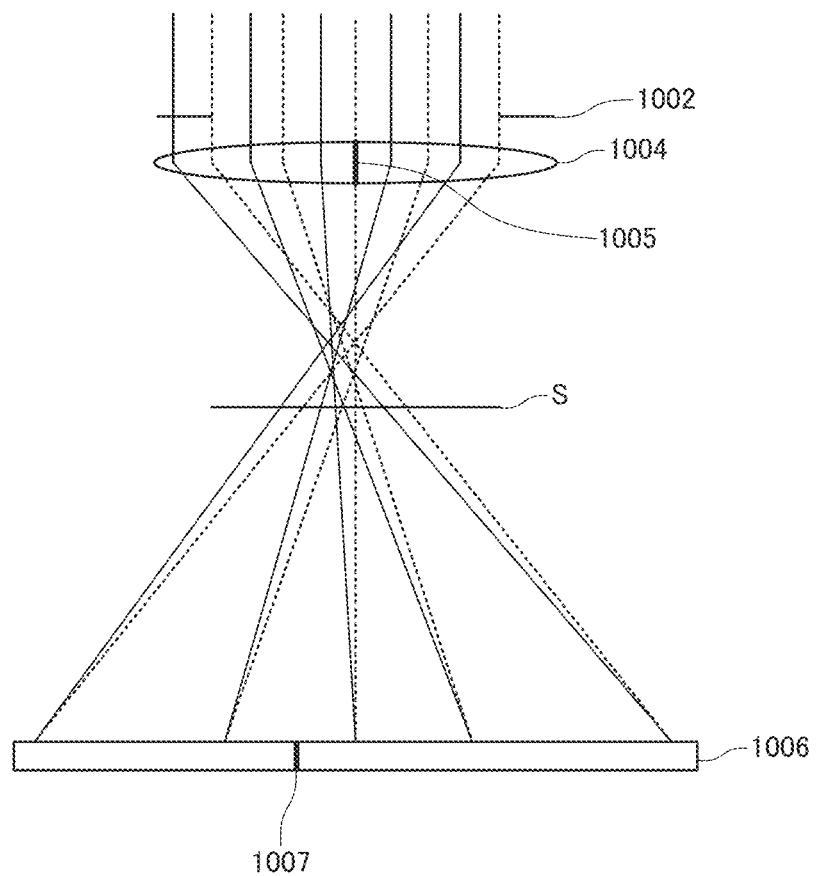
FIG. 17 is a diagram for explaining how an apparent aberration due to an axial disagreement occurs.
Figure 18:
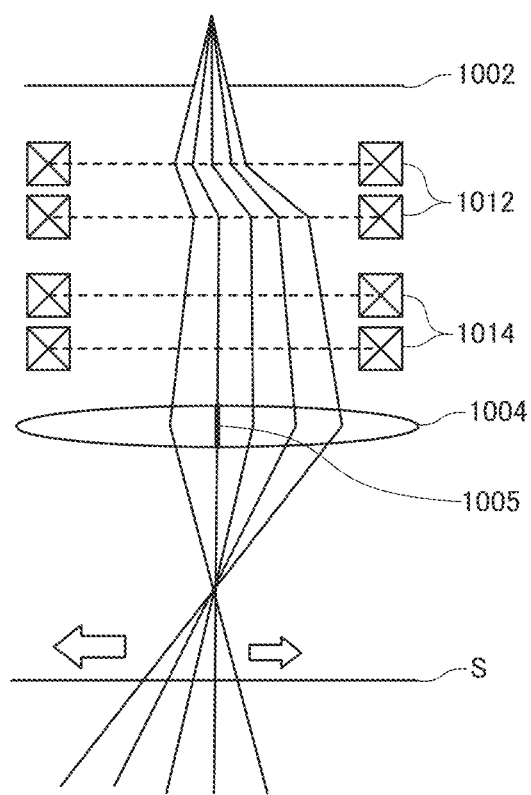
FIG. 18 is a diagram for explaining an example of a method of obtaining a position of an optical axis of an objective lens.
Figure 19:
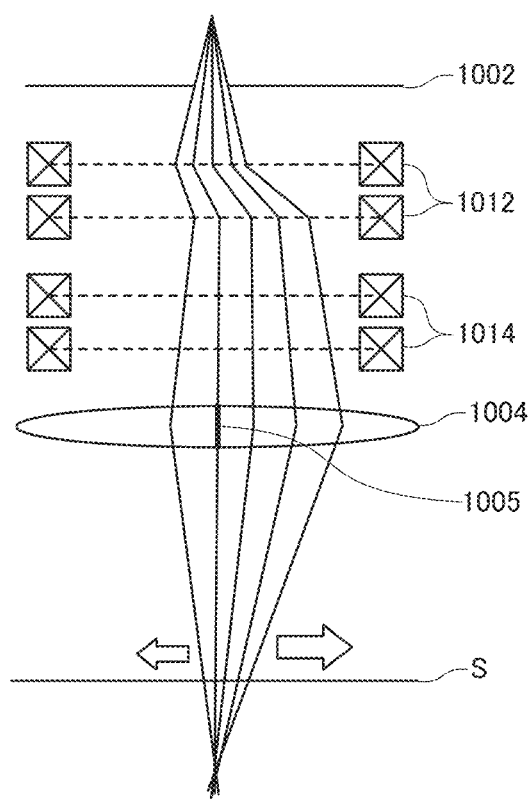
FIG. 19 is a diagram for explaining an example of a method of obtaining a position of an optical axis of an objective lens.
Figure 20:
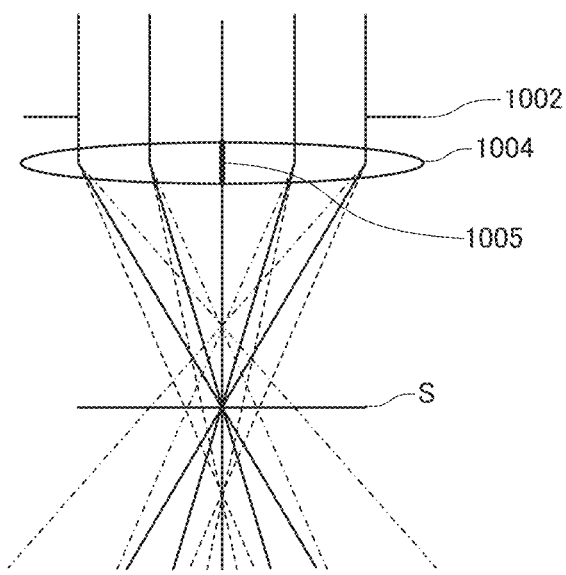
FIG. 20 is a diagram for explaining an image shift due to an axial disagreement between an optical axis of an objective lens and an objective current center of the objective lens.

FIG. 13 is a flow chart illustrating a modification of the aberration measurement method according to the second embodiment.

As shown in FIG. 13, in this modification, the step of aligning the optical axis 202 of the objective lens 20 and the coordinate origin O with each other (step S310 shown in FIG. 10) is not performed. In this modification, after the step of measuring the position of the optical axis 202 of the objective lens 20 on the detector plane 232 (S308), a Ronchigram is acquired (S314) and a measurement of an aberration of the objective lens 20 is performed (S316). When performing the aberration measurement, a measurement result of the aberration of the objective lens 20 is corrected based on the position of the optical axis 202 of the objective lens 20 on the detector plane 232. Specifically, a calculation is performed by applying a correction so that the position of the coordinate origin O is aligned with a local minimum point where a change in an apparent aberration has a local minimum value. Accordingly, an apparent aberration does not appear in a result of an aberration calculation.

According to this modification, a similar working effect to that of the embodiment described above can be produced. It should be noted that the process of this modification may be performed by the aberration measuring unit 56.

The invention is not limited to the embodiments described above, and various modifications and variations may be made of the above embodiments without departing from the scope of the invention.

For example, while an aberration of the objective lens 20 is calculated based on an image shift (a geometrical aberration) of an acquired STEM image of each of the detection regions D1 to D8 in the first embodiment described above and an aberration of the objective lens 20 is calculated based on a Ronchigram in the second embodiment described above, methods of calculating an aberration are not limited thereto and various known methods of calculating an aberration can be applied.

It should be noted that the embodiments and the modifications described above are merely examples and the invention is not limited thereto. For example, the respective embodiments and the respective modifications may be combined as appropriate.

The invention includes various other configurations that are substantially identical to the configurations described in the embodiments (for example, configurations having identical functions, methods, and results or configurations having identical objectives and effects). The invention also includes various other configurations in which non-essential elements described in the embodiments are replaced by other elements. The invention also includes various other configurations having the same effects as those of the configurations described in the embodiments, or various other configurations capable of achieving the same objectives as those of the configurations described in the embodiments. Furthermore, the invention includes various other configurations in which known techniques are added to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. An aberration measurement method for an objective lens in an electron microscope comprising an objective lens which focuses an electron beam that illuminates a specimen, and a detector which detects an electron beam having passed through the specimen, the aberration measurement method comprising:

introducing a coma aberration to the objective lens;
measuring an aberration of the objective lens before introducing the coma aberration to the objective lens;
measuring an aberration of the objective lens after introducing the coma aberration to the objective lens; and
obtaining a position of an optical axis of the objective lens on a detector plane of the detector based on measurement results of the aberration of the objective lens before and after introducing the coma aberration.

2. The aberration measurement method according to claim 1,
wherein, in obtaining the position of the optical axis of the objective lens, the position of the optical axis of the objective lens on the detector plane is obtained based on a change in an apparent aberration before and after introducing the coma aberration.

3. The aberration measurement method according to claim 2,
wherein, in obtaining the position of the optical axis of the objective lens, a position where an amount of change in the apparent aberration has a local minimum value on the detector plane is adopted as the position of the optical axis of the objective lens on the detector plane.

4. The aberration measurement method according to claim 1,
wherein the detector is a segmented detector in which the detector plane is segmented into a plurality of detection regions,
wherein the electron microscope is provided with an aperture for limiting a region of the detection regions on which an electron beam is to be incident, and
wherein, in measuring the aberration of the objective lens before introducing the coma aberration to the objective lens, and in measuring the aberration of the objective lens after introducing the coma aberration to the objective lens, the aberration is obtained from a scanning transmission electron microscope image of each of the detection regions, obtained by using the aperture.

5. The aberration measurement method according to claim 1,
wherein the detector is a solid-state imaging element on which a plurality of light receiving elements are arranged, and
wherein, in measuring the aberration of the objective lens before introducing the coma aberration to the objective lens, and in measuring the aberration of the objective lens after introducing the coma aberration to the objective lens, the aberration is obtained from a Ronchigram acquired by using the solid-state imaging element.

6. The aberration measurement method according to claim 1,
wherein, in introducing the coma aberration to the objective lens, the coma aberration is introduced by tilting an electron beam incident on the specimen.

7. The aberration measurement method according to claim 6,
wherein the electron microscope is provided with an illumination system deflector which deflects an electron beam incident on the specimen,
wherein the illumination system deflector has deflection elements disposed in multiple stages, and
wherein an electron beam incident on the specimen is tilted by using the illumination system deflector.

8. The aberration measurement method according to claim 1, further comprising: after obtaining the position of the optical axis of the objective lens on the detector plane, aligning the optical axis of the objective lens with an axis of the detector based on the obtained position of the optical axis of the objective lens on the detector plane.

9. The aberration measurement method according to claim 8,
wherein the electron microscope is provided with an imaging system deflector which deflects an electron beam having passed through the specimen and incident on the detector plane, and
wherein, in aligning the optical axis of the objective lens with the axis of the detector, an electron beam is deflected by the imaging system deflector based on the obtained position of the optical axis of the objective lens on the detector plane.

10. The aberration measurement method according to claim 9, further comprising:
measuring an aberration of the objective lens after aligning the optical axis of the objective lens with the axis of the detector.

11. The aberration measurement method according to claim 1, further comprising:
correcting a measurement result of the aberration of the objective lens based on the obtained position of the optical axis of the objective lens on the detector plane.

12. An electron microscope comprising:
an objective lens which focuses an electron beam that illuminates a specimen;
a detector which detects an electron beam having passed through the specimen; and
an aberration measuring unit which measures an aberration of the objective lens,
the aberration measuring unit performing a process of obtaining a position of an optical axis of the objective lens on a detector plane of the detector based on measurement results of an aberration before and after introducing a coma aberration to the objective lens.

13. The electron microscope according to claim 12, further comprising:
an illumination system deflector which tilts an electron beam incident on the specimen.

* * * * *